US012640738B2

(12) United States Patent
Huang et al.

(10) Patent No.: US 12,640,738 B2
(45) Date of Patent: May 26, 2026

(54) SEMICONDUCTOR DEVICE INCLUDING DELAY-ENHANCED INVERTER CIRCUIT AND METHOD OF FORMING SAME

(71) Applicants: TAIWAN SEMICONDUCTOR MANUFACTURING COMPANY, LTD., Hsinchu (TW); TSMC NANJING COMPANY, LIMITED, Nanjing (CN)

(72) Inventors: Yi Yun Huang, Hsinchu (TW); Feng Lin, Hsinchu (TW); SiLiang Xie, Hsinchu (TW); PingPing Liu, Hsinchu (TW); Qingchao Meng, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 275 days.

(21) Appl. No.: 18/182,782

(22) Filed: Mar. 13, 2023

(65) Prior Publication Data

US 2024/0267049 A1    Aug. 8, 2024

(30) Foreign Application Priority Data

Feb. 6, 2023    (CN) .......................... 202320119675.2

(51) Int. Cl.
*H03K 19/0185* (2006.01)
*H03K 19/00* (2006.01)
*H03K 19/0948* (2006.01)

(52) U.S. Cl.
CPC . *H03K 19/018521* (2013.01); *H03K 19/0013* (2013.01); *H03K 19/09482* (2013.01)

(58) Field of Classification Search
CPC ....... H03K 19/018521; H03K 19/0013; H03K 19/09482
See application file for complete search history.

(56) References Cited

U.S. PATENT DOCUMENTS

| | | | |
|---|---|---|---|
| 4,931,668 A | 6/1990 | Kikuda et al. | |
| 5,302,871 A * | 4/1994 | Matsuzaki ............. | H03K 5/133 327/566 |
| 5,920,221 A | 7/1999 | Shen et al. | |

(Continued)

FOREIGN PATENT DOCUMENTS

| | | |
|---|---|---|
| CN | 1231081 | 10/1999 |
| CN | 1391349 | 1/2003 |
| TW | 201421902 | 6/2014 |

*Primary Examiner* — Daniel D Chang
(74) *Attorney, Agent, or Firm* — Hauptman Ham, LLP

(57) ABSTRACT

A delay-enhanced inverter circuit (DE-inverter) includes: a non-delay-enhanced inverter circuit (NE-inverter) having an output at a first node and an input at a second node; and a capacitive device feedback-coupled between the first node and the second node. The capacitive device includes: a first positive-channel metal-oxide (PMOS) field-effect transistor (FET) (PFET) feedback-coupled between the first node and the second node, the first PFET having a capacitor-configuration; and a first negative-channel metal-oxide (NMOS) FET (NFET) feedback-coupled between the first node and the first reference voltage, the first NFET having a capacitor-configuration.

20 Claims, 25 Drawing Sheets

(56) References Cited

U.S. PATENT DOCUMENTS 6,169,421 B1 * 1/2001 Bryan ................ H03K 19/0013
326/87
2003/0231034 A1 * 12/2003 Koch, II ............ H03K 19/0013
327/112
2019/0190505 A1 6/2019 Yi et al.

* cited by examiner

Legend:
- N-Well
- Substrate
- Gate
- AR
- Gate Insulator
- MD
- MG
- IDG
- VG
- VD
- M_1st_B
- M_1st_A
- M_2nd
- VIA_1st

227 P-substrate

Z-axis

Y-axis

229 N-well    227 P-substrate

600B

610    Form substrate

612    Form ARs including doping corresponding areas of substrate

614    Form S/D regions representing 1st transistor components (Tcs) at locations correspondingly in ARs including doping corresponding 1st areas of ARs, wherein 2nd areas between corresponding S/D regions are channel regions representing 2nd TCs 616    Form gate lines representing 4th TCs over corresponding ones of the channel regions 618    Form metal-to-S/D (MD) contact structures over corresponding SD regions MD contract regions representing 3rd TCs 620    Forming interconnection structures representing 5th TCs over corresponding ones of gate lines and MD contact structures 622    Forming metallization segments over corresponding ones of first interconnection structures

FIG. 6B

SEMICONDUCTOR DEVICE INCLUDING DELAY-ENHANCED INVERTER CIRCUIT AND METHOD OF FORMING SAME

PRIORITY CLAIM

The present application claims the priority of China Application No. 202320119675.2, filed Feb. 6, 2023, which is incorporated herein by reference in its entirety.

BACKGROUND

The integrated circuit (IC) industry produces a variety of analog and digital semiconductor devices to address issues in different areas. Developments in semiconductor process technology nodes have progressively reduced component sizes and tightened spacing resulting in progressively increased transistor density. ICs progressively become smaller.

BRIEF DESCRIPTION OF THE DRAWINGS

One or more embodiments are illustrated by way of example, and not by limitation, in the figures of the accompanying drawings. The drawings are not to scale, unless otherwise disclosed.

FIGS. 2K-2M are cross-sectional diagrams, in accordance with some embodiments.

FIGS. 6A-6B are flow diagrams of corresponding methods of manufacturing a semiconductor device, in accordance with some embodiments.

DETAILED DESCRIPTION

Figure 1:
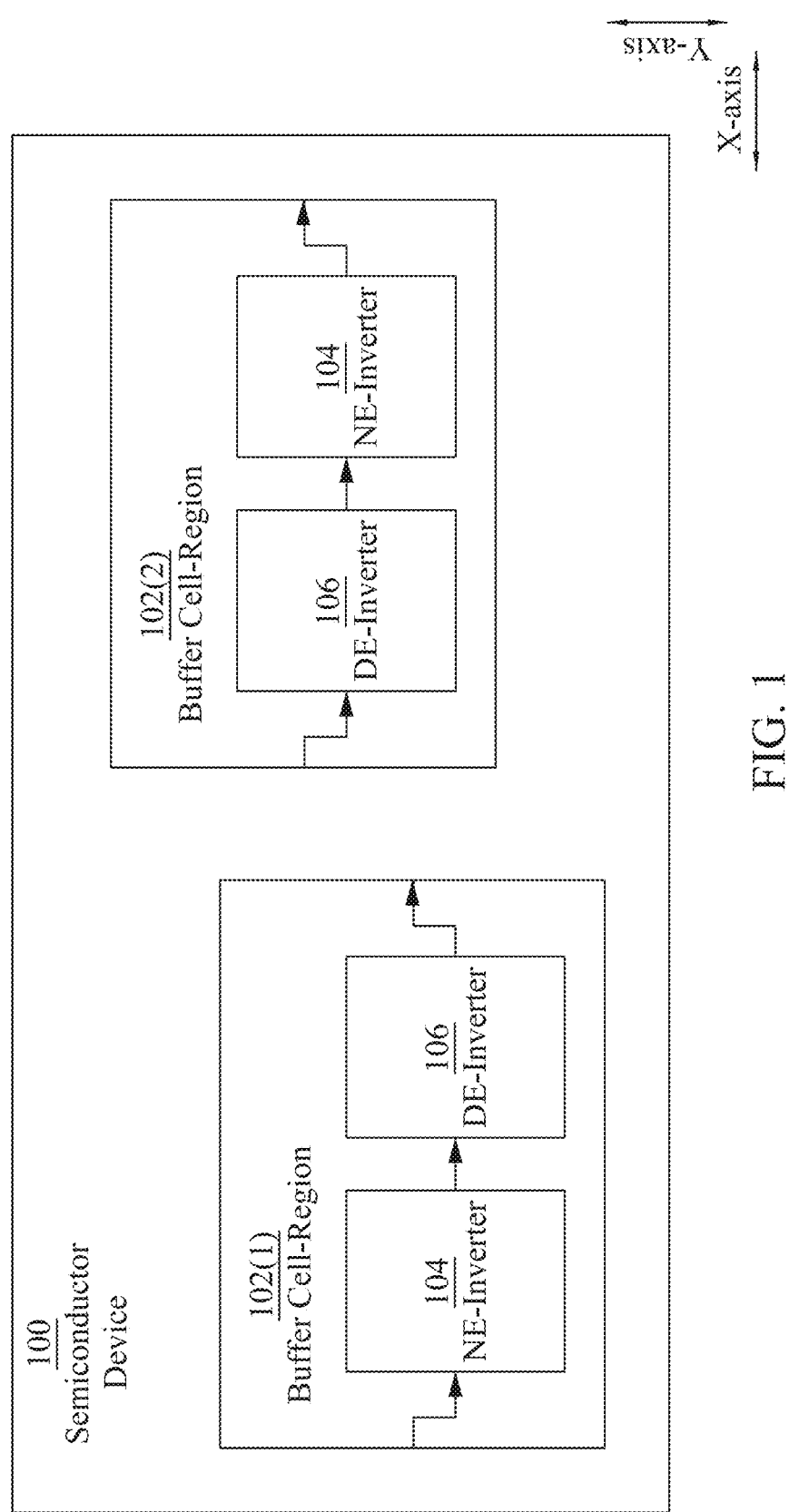
FIG. 1 is a block diagram of a semiconductor device, in accordance with some embodiments.

The following discloses many different embodiments, or examples, for implementing different features of the subject matter. Examples of components, materials, values, steps, operations, arrangements, or the like, are described below to simplify the present disclosure. These are, of course, examples and are not intended to be limiting. Other components, values, operations, materials, arrangements, or the like, are contemplated. For example, the formation of a first feature over or on a second feature in the description that follows include embodiments in which the first and second features are formed in direct contact, and further include embodiments in which additional features are formed between the first and second features, such that the first and second features are in indirect contact. In addition, the present disclosure repeats reference numerals and/or letters in the various examples. This repetition is for purposes of simplicity of illustration in the figures and reduced repetition of corresponding discussion in the specification; the scope of any relationship imputable from elements-in-common between the various embodiments and/or configurations discussed are informed by looking at contextual differences between common elements and distinct elements in different embodiments. For example, these contextual differences include differences resulting from the function of the distinct elements, differences of interconnection among otherwise-common elements, differences of timing relationships for otherwise-common elements, the resulting changes in interconnections and timing relationships in the otherwise-common elements because of the operation of the distinct elements, and/or the like Further, spatially relative terms, such as "beneath," "below," "lower," "above," "upper" or the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus is otherwise oriented (rotated 90 degrees or at other orientations) and the spatially relative descriptors used herein are likewise interpreted accordingly. In some embodiments, the term standard cell structure refers to a standardized building block included in a library of various standard cell structures. In some embodiments, various standard cell structures are selected from a library thereof and are used as components in a layout diagram representing a circuit.

In some embodiments, a delay-enhanced inverter circuit (DE-inverter) includes a non-delay-enhanced inverter circuit NE-inverter having an output at a first node and an input at a second node, and a capacitive device feedback-coupled between the first node and the second node, the capacitive device including: a first positive-channel metal-oxide (PMOS) field-effect transistor (FET) (PFET) feedback-coupled between the first node and the second node, the first PFET having a capacitor-configuration; and a first negative-channel metal-oxide (NMOS) FET (NFET) feedback-coupled between the first node and the first reference voltage, the first NFET having a capacitor-configuration. The feedback-coupled capacitive device exploits the Miller Effect.

According to a first other approach, a buffer representing a counterpart to the buffer of present embodiments has the same number of PFETs and NFETs but has no non-switching (NS) FETs. An inverter of the first other approach's buffer which represents a counterpart to the DE-inverter of present embodiments is not arranged with a capacitive device in a feedback-coupling with respect to the inverter, i.e., does not have a counterpart to the capacitive device of present embodiments. By exploiting the Miller Effect, the NE-inverter of present embodiments achieves improved performance as compared to the counterpart NE-inverter according to the first other approach (as discussed above) without incurring a disadvantage of a larger footprint (area). Rather, as compared to footprint (area) of the NE-inverter according to the first other approach, the DE-inverter of present embodiments exhibits substantially the same footprint, i.e., the footprint of the DE-inverter of present embodiments is not larger than the footprint of the counterpart NE-inverter according to the first other approach.

FIG. 1 is a block diagram of a semiconductor device 100, in accordance with some embodiments.

Semiconductor device 100 includes a buffer cell region 102(1) and a buffer cell region 102(2).

Buffer cell region 102(1) includes a non-delay-enhanced inverter (NE-inverter) cell region 104 and a delay-enhanced inverter (DE-inverter) cell region 106. An input of the NE-inverter cell region 104 represents an input of buffer cell region 102(1). An output of NE-inverter cell region 104 represents an input of DE-inverter cell region 106. An output of DE-inverter cell region 106 represents an output of buffer cell region 102(1). Because of DE-inverter cell region 106, buffer cell region 102(1) is also delay-enhanced. In some embodiments, buffer cell region 102(1) is referred to as delay cell region 102(1).

Buffer cell region 102(1) is arranged with NE-inverter cell region 104 coupled in series ahead of DE-inverter cell region 106 (e.g., FIGS. 2A, 3A, 4A, 5A-5B, or the like).

Buffer circuits (e.g., FIGS. 2A, 2D, 3A, 4A, 5A-5B, or the like) representing examples of buffer cell region 102(1) are discussed below. NE-inverter circuits (e.g., FIGS. 2A, 2D, 3A, 4A, 5A-5B, or the like) representing examples of NE-inverter cell region 104 are discussed below. DE-inverter circuits (e.g., FIGS. 2A, 2D, 3A, 4A, 5A-5B, or the like) representing examples of DE-inverter cell region 106 are discussed below.

Buffer cell region 102(2) is similar to buffer cell region 102(1) because buffer cell region 102(2) also includes NE-inverter cell region 104 and DE-inverter cell region 106. Nevertheless, buffer cell region 102(2) differs from buffer cell region 102(1), e.g., because buffer cell region 102(2) is arranged with DE-inverter cell region 106 coupled in series ahead of NE-inverter cell region 104 (e.g., FIG. 2D, or the like). In some embodiments, buffer cell region 102(2) is referred to as delay cell region 102(2).

Figure 2A:
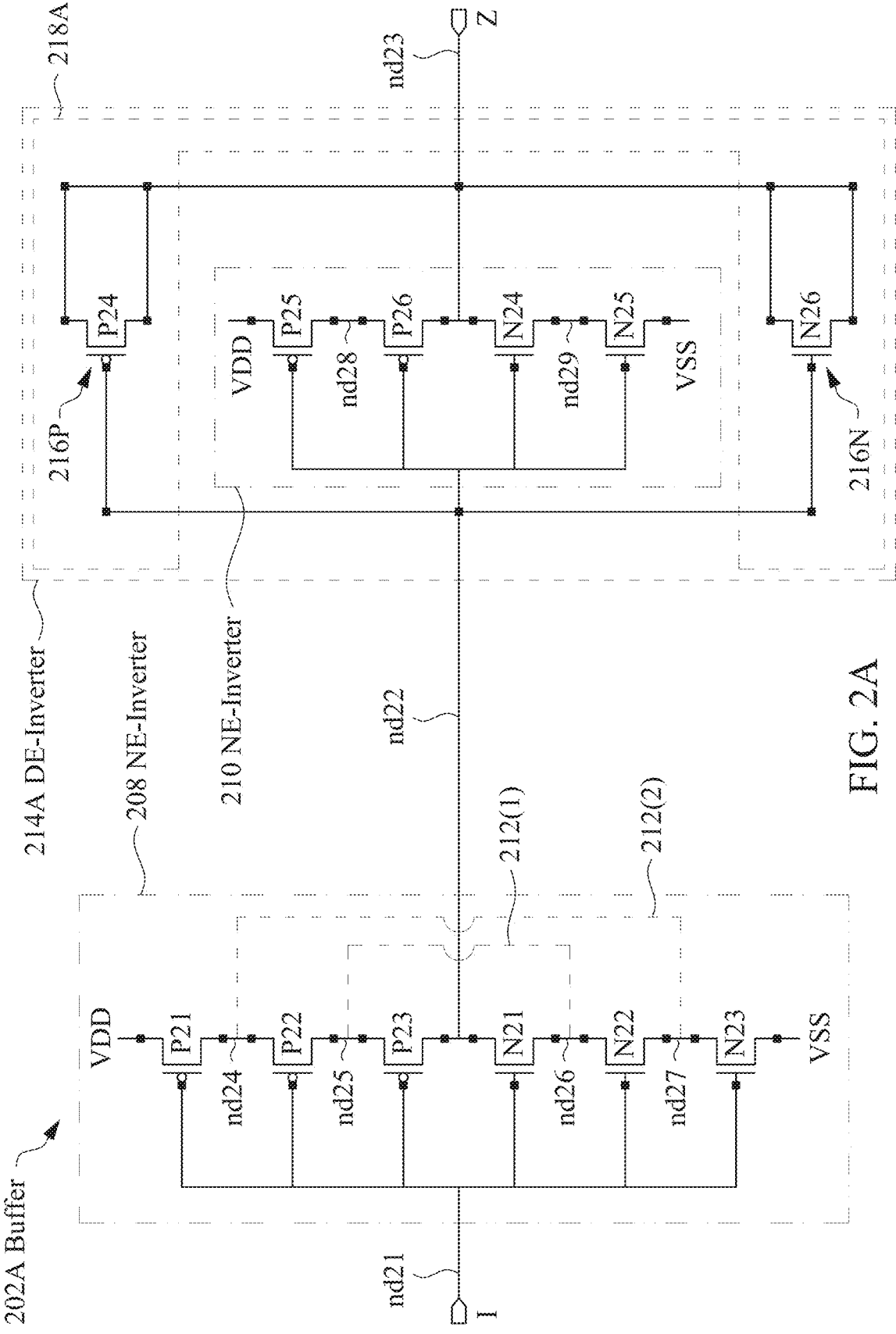
FIG. 2A is a schematic diagram of a circuit, in accordance with some embodiments.

FIG. 2A is a schematic diagram of a buffer circuit 202A, in accordance with some embodiments.

Buffer circuit (for simplicity, hereinafter buffer) 202A includes non-delay-enhanced inverter circuit (for simplicity, hereinafter NE-inverter) 208 and a delay-enhanced inverter circuit (for simplicity, hereinafter DE-inverter) 214A. In some embodiments, buffer 202A is referred to as delay cell 202A. A semiconductor device having a buffer cell-region corresponding to buffer 202A is an example of buffer cell region 102(1) of FIG. 1. Buffer 202A includes 6 PFETs and 6 NFETs for a total of 12 FETs.

In FIG. 2A, an input of buffer 202A is represented by a node nd21 which also represents an input of NE-inverter 208. An output of NE-inverter 208 is represented by a node nd22 which also represents an input of DE-inverter 214A, i.e., DE-inverter 214A is coupled in series with NE-inverter 208. An output of DE-inverter 214A is represented by a node nd23 which also represents an output of buffer 202A.

NE-inverter 208 includes positive-channel metal-oxide (PMOS) field-effect transistors (FET) (PFETs) P21, P22 and P23 and negative-channel metal-oxide (NMOS) FETs (NFETs) N21, N22 and N23 coupled in series between a first reference voltage and a second reference voltage. In some embodiments, the first reference voltage is VDD and the second reference voltage is VSS. Transistor P21 is coupled between VDD and a node nd24. Transistor P22 is coupled between node nd24 and a node nd25. Transistor P23 is coupled between node nd25 and node nd22. Transistor N21 is coupled between node nd22 and a node nd26. Transistor N22 is coupled between node nd26 and a node nd27. Transistor N23 is coupled between node nd27 and VSS. In some embodiments, NE-inverter 208 is described as a six-stack inverter, i.e., is described as having a stack of six transistors. In some embodiments, buffer 202A is described as having two stages corresponding to NE-inverter 208 and DE-inverter 214A.

In some embodiments, NE-inverter 208 is a float-resistant inverter. As used herein, a float-resistant inverter includes one or more float-resisting shunts (discussed below) that are not included in a basic inverter; accordingly, a basic inverter is an inverter that lacks the one or more float-resisting shunts of a float-resistant inverter.

In a general context of an inverter that includes at least two PFETs and at least two corresponding NFETs, a node at which two PFETs are serially coupled together is referred to herein as a PMOS-serial node, and a node at which two NFETs are serially coupled together is referred to herein as an NMOS-serial node. An anti-float shunt couples a PMOS-serial node to a corresponding NMOS-serial node. In such an inverter: the PFETs are off when the NFETs are on which can give rise to a floating state at the PMOS-serial node(s); and the NFETs are off when the PFETs are on which can give rise to a floating state at the NMOS-serial node(s). An anti-float shunt reduces the chances of a floating state on the PMOS-serial node when the two corresponding PFETs are off, and similarly reduces the chance of a floating state on the NMOS node when the two corresponding NFETs are off.

In such embodiments in which NE-inverter 208 is a float-resistant inverter, NE-inverter 208 includes anti-float shunt 212(1) and anti-float shunt 212(2). Anti-float shunt 212(1) couples P-serial node nd25 (at which transistors P22 and P23 are serially coupled together) to N-serial node nd26 (at which transistors N21 & N22 are serially coupled together); and anti-float shunt 212(2) couples P-serial node nd24 (at which transistors P21 and P22 are serially coupled together) to N-serial node nd27 (at which transistors N22 & N23 are serially coupled together). An anti-float shunt 212(1) reduces the chances of a floating state on PMOS-serial node nd25 when PFETs P22 and P23 are off while NFETs N21 and N22 are on, and similarly reduces the chances of a floating state on NMOS-serial node nd26 when PFETs P22 and P23 are on while NFETs N21 and N22 are off. An anti-float shunt 212(2) reduces the chances of a floating state on PMOS-serial node nd24 when PFETs P21 and P22 are off while NFETs N22 and N23 are on, and similarly reduces the chances of a floating state on NMOS-serial node nd27 when PFETs P21 and P22 are on while NFETs N22 and N23 are off. The optional aspect of ant-float shunts 212(1) and 212(2) is indicated by using phantom (dashed) shunts to represent ant-float shunts 212(1) and 212(2).

DE-inverter 214A includes an NE-inverter 210 and a capacitive device 218A, where capacitive device 218A is feedback-coupled between nodes nd23 and nd22. NE-inverter 210 includes PFETs P25 and P26 and NFETs N24 and N25 coupled in series between VDD and VSS. Transistor P25 is coupled between VDD and a node nd28. Transistor P26 is coupled between node nd28 and node nd23. Transistor N24 is coupled between node nd23 and a node nd29. Transistor N25 is coupled between node nd29 and VSS. In some embodiments, NE-inverter 210 is described as a four-stack inverter, i.e., is described as having a stack of four transistors.

Capacitive device 218A includes capacitive components 216P and 216N, each of which is feedback-coupled between nodes nd23 and nd22. Capacitive component 216P includes a PFET P24 having a capacitor-configuration. A gate terminal of transistor P24 is coupled to node nd22. Both source/drain (S/D) terminals of transistor P24 are coupled to node nd23. Capacitive component 216N includes an NFET N26 having a capacitor-configuration. A gate terminal of transistor N26 is coupled to node nd22. Both S/D terminals of transistor N26 are coupled to node nd23. In total, DE-inverter 214A includes six transistors. In light of transistors P24 and N26 being capacitor-configured, in some embodiments, DE-inverter 214A is described as a 4-stack inverter.

Signal-propagation delay is the delay experienced by a signal as it propagates between two nodes in a circuit. The signal-propagation delay from the input to the output of NE-inverter 210 alone is smaller than the signal-propagation delay from nodes nd22 to nd23 through NE-inverter 210 albeit with the feedback-coupling arrangement of capacitive device 218A between nodes nd23 and nd22. As used herein, the phrase, 'signal-propagation delay through NE-inverter 210 alone,' refers to the signal-propagation delay that otherwise would be experienced from node nd22 to node nd23 through NE-inverter 210 without there being the feedback-coupling arrangement of capacitive device 218A between nodes nd23 and nd22. In other words, the signal-propagation delay through NE-inverter 210 alone is smaller than the signal-propagation delay through DE-inverter 214A.

Because the signal propagation-delay through DE-inverter 214A is greater than the signal-propagation delay through NE-inverter 210 alone, DE-inverter 214A is described as having an enhanced delay as compared to NE-inverter 210 alone, i.e., as being delay-enhanced (DE) as compared to NE-inverter 210 alone. As compared to NE-invert 210 alone, the enhancement in the signal-propagation delay through DE-inverter 214A is attributable to the feedback-coupling of capacitive device 218A between nodes nd23 and nd22.

According to a first other approach, a buffer representing a counterpart to buffer 202A has 6 PFETs and 6 NFETs none of which is an NS_FET (discussed below). An inverter of the first other approach's buffer which represents a counterpart to DE-inverter 214A is not arranged with a capacitive device in a feedback-coupling with respect to the inverter, i.e., does not have a counterpart to capacitive device 218A, but instead is arranged as a 4-stack NE-inverter. In terms of various performance parameters, the buffer according to the first other approach was compared against buffer 202A for the same set of conditions. Among other things, as compared to the buffer according to the first other approach: buffer 202A exhibits a reduction in power consumption of about 63.5% and buffer 202A exhibits a reduction in leakage power of about 50.6%.

According to a second other approach, a buffer representing a counterpart to buffer 202A has 6 PFETs and 6 NFETs arranged in two stages of which none of the transistors is an NS_FET (discussed below). An inverter of the second other approach's buffer which represents a counterpart to DE-inverter 214A is not arranged with a capacitive device in a feedback-coupling with respect to the inverter, i.e., does not have a counterpart to capacitive device 218A, but instead is arranged as a 4-stack NE-inverter. In terms of various performance parameters, the buffer according to the second other approach was compared against buffer 202A for the same set of conditions. Among other things, as compared to the buffer according to the second other approach: buffer 202A exhibits reduced variation in slew rate, SR, in a range $(\approx56.5\%)\leq SR\leq(\approx67.4\%)$; and buffer 202A exhibits a reduced variation in delay, D, in a range $(\approx14.4\%)\leq D\leq (\approx52.6\%)$.

In FIG. 2A, arranging capacitive device 218A in a feedback-coupling with respect to nodes nd23 and nd22 of NE-inverter 210 exploits the Miller Effect. Let us consider a first given capacitor which occupies a first area, A1, and which has a capacitance, C1, when the first given capacitor is measured as a discrete element. When the first given capacitor is included in a circuit, and more particularly is arranged in a feedback-coupling of an inverting amplifier, the first given capacitor interacts with internal capacitances of the inverting amplifier so as to behave in the circuit as if the given capacitor has a larger second capacitance. This behavior is referred to as the Miller effect, and the effectively larger second capacitance is referred to as the Miller capacitance, CM. In particular, CM=C1 (1+G), where G is the gain of the inverting amplifier. Instead of the first given capacitor, if a second given capacitor having a capacitance C2=CM was coupled to the inverter of the other approach albeit not in feedback-coupling, the second given capacitor would have to occupy a second area, A2, larger than the first area A1, i.e., A1<A2.

By exploiting the Miller Effect, buffer 202A achieves improved performance as compared to the buffer according to the other approach (as discussed above) without incurring a disadvantage of a larger footprint (area). Rather, as compared to footprint (area) of the buffer according to the other approach, buffer 202A exhibits substantially the same footprint, i.e., the footprint of buffer 202A is not larger than the footprint of the buffer according to the other approach.

In FIG. 2A, in some embodiments, DE-inverter 214A is described in terms of switching-configured (SW) FETs (SW_FETs) and non-switching-configured (NS) FETs (NS_FETs). In DE-inverter 214A: transistors P25-P26 and N24-N25 are SW_FETs whereas transistors P24 and N26 are NS_FETs; and the number of SW_FETs, CSW, is CSW=4, which is greater than the number of NS_FETs, CNS, where CNS=2. In DE-inverter 214A: a sum, $\Sigma$, of the number of SW_FETs and the number of the NS_FETs is $\Sigma$=CSW+ CNS=6; a ratio of the number of the NS_FETs divided by the sum is CNS/$\Sigma$=1/3; and a ratio of the number of the SW_FETs divided by the sum is CSW/$\Sigma$=2/3.

In FIG. 2A, in some embodiments, buffer 202A is described in terms of SW_FETs and NS_FETs. In buffer 202A: transistors P21-P23, P25-P26 and N21-N25 are SW_FETs whereas transistors P24 and N26 are NS_FETs; and the number of SW_FETs is CSW=10, which is greater than the number of NS_FETS, where CNS=2. In buffer 202A: the sum of the number of SW_FETs and NS_FETs is $\Sigma$=12; a ratio of the number of the NS_FETs divided by the sum of the number of SW_FETs and NS_FETs is CNS/$\Sigma$=1/ 6; and a ratio of the number of the SW_FETs divided by the sum is CSW/$\Sigma$=5/6.

Figure 2B:
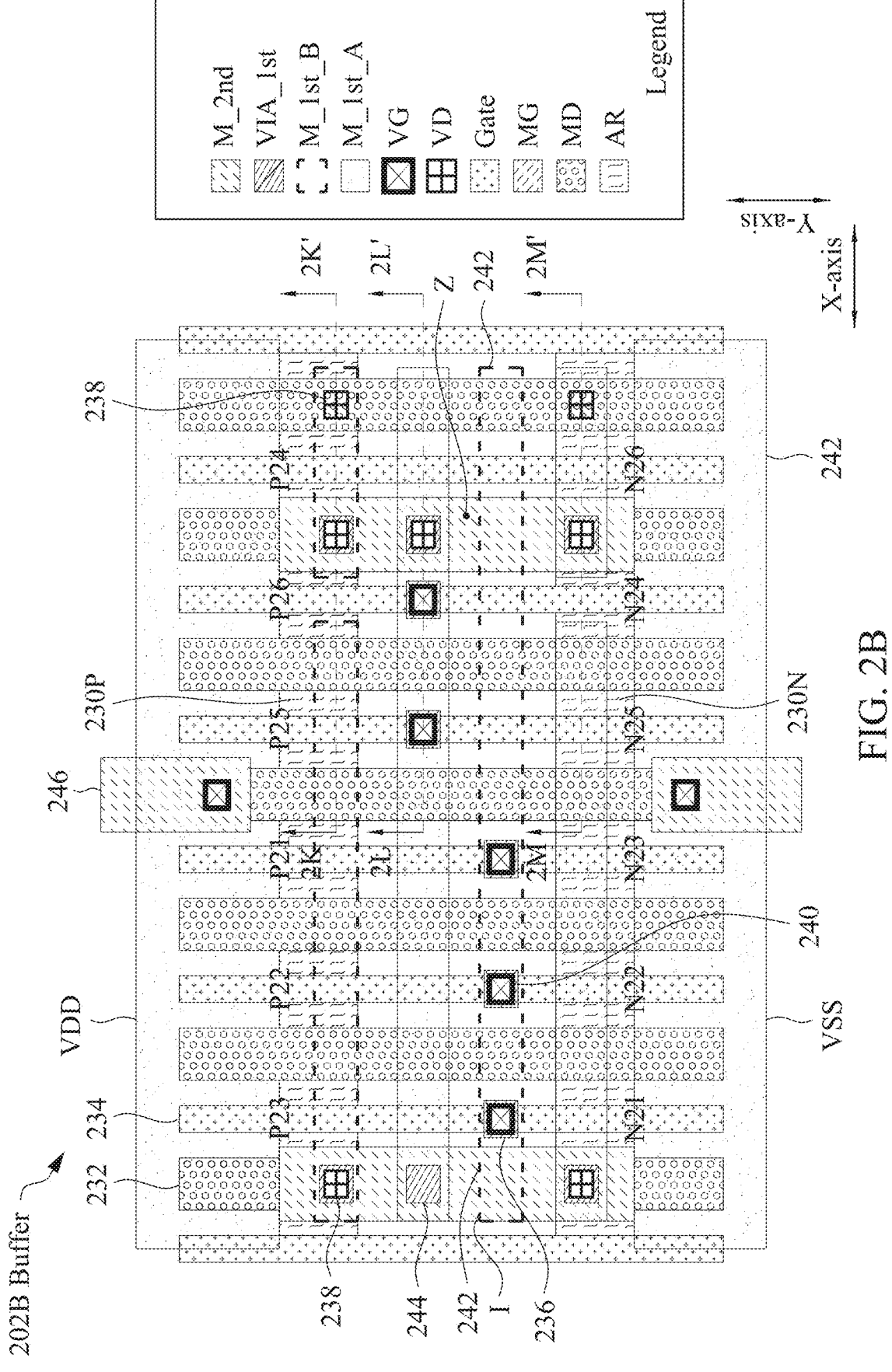
FIGS. 2B-2C are layout diagrams corresponding to the circuit of FIG. 2A, in accordance with some embodiments.

FIG. 2B is a layout diagram of buffer 202B which corresponds to buffer 202A of FIG. 2A, in accordance with some embodiments.

A semiconductor device having a buffer cell-region based on buffer 202B is an example of buffer cell region 102(1) of FIG. 1. General locations of PFETs P21-P26 and NFETs N21-N26 are shown in FIG. 2B.

In general, a layout diagram represents a semiconductor device. Shapes in the layout diagram represent corresponding components in the semiconductor device. The layout diagram per se is a top view. Shapes in the layout diagram are two-dimensional relative to, e.g., the X-axis and the Y-axis, whereas the semiconductor device being represented is three-dimensional. Typically, relative to the Z-axis, the semiconductor device is organized as a stack of layers in which are located corresponding structures, i.e., to which belong corresponding structures. Accordingly, each shape in the layout diagram represents, more particularly, a component in a corresponding layer of the corresponding semiconductor device. Typically, the layout diagram represents relative depth, i.e., positions along the Z-axis, of shapes and thus layers by superimposing a second shape on a first shape so that the second shape at least partially overlaps the first shape. Regarding some similarly sized contact structures which are stacked in a layout diagram along the Z-axis, the stacking order, e.g., VD and VIA_1st contact structures (discussed below), the stacking order along the Z-axis is reversed relative to the Z-axis stacking order of the corresponding contact structures in the corresponding semiconductor device, this being done for simplicity of illustration. For simplicity of discussion, i.e., as a discussion-expedient, some elements in layout diagram (e.g., FIG. 2B and the other layout diagrams disclosed herein) are referred to as if they are counterpart structures in a corresponding semiconductor device rather than patterns/shapes per se.

Layout diagrams vary in terms of the amount of detail represented. In some circumstances, selected layers of a layout diagram are combined/abstracted into a single layer, e.g., for purposes of simplification. Alternatively, and/or additionally, in some circumstances, not all layers of the corresponding semiconductor device are represented, i.e., selected layers of the layout diagram are omitted, e.g., for simplicity of illustration. FIG. 2B and the other layout diagrams disclosed herein are examples of layout diagrams in which selected layers have been omitted, e.g., a substrate and interconnection & metallization layers over the M_2nd layer are omitted in FIG. 2B.

In FIG. 2B, buffer 202B includes an active region (AR) 230P which is configured for PMOS technology and an AR 230N which is configured for NMOS technology. Each of ARs 230P and 230N has a long axis that extends in a first direction, e.g., the direction of the X-axis. Each of ARs 230P and 230N has a short axis that extends in a second direction perpendicular to the first axis, e.g., the second direction is the direction of the Y-axis. ARs 230P and 230N include doped first areas that represent source/drain (S/D) regions (not shown) of the ARs. The S/D regions represent first transistor-components. Second areas of ARs 230P and 230N which are between corresponding S/D regions are channel regions (not shown) that represent second transistor-components.

In FIG. 2B and in other layout diagrams disclosed herein, relative to the Y-axis, a distance or size is alternately referred to as a height. Each of ARs 230P and 230N has a height. The height is determined by design rules of the corresponding semiconductor process technology node. Relative to the Y-axis, ARs 230P and 230N are spaced apart with corresponding gaps.

Gate lines 234 are over corresponding ones of the channel regions. Gate lines 234 represent third transistor-components. Long axes of gate lines 234 extend parallel to the Y-axis. Metal-to-S/D (MD) contact structures 232 are over corresponding ones of the S/D regions. MD contact structures 232 represent fourth transistor-components. In some embodiments, a given S/D region is formed by doping a portion of an AR that is between corresponding instances of gate lines 234 or that is adjacent to a corresponding instance of an IDG (FIG. 3B) with an appropriate conductivity-type dopant. Metal-to-gate (MG) contact structures 236 are over corresponding ones of gate lines 234. In some embodiments, MG contact structures 236 represent a first type of fifth transistor-components.

Via-to-MD (VD) contact structures 238 represent connections between corresponding MD contact structures 232 and conductive segments in a first level of metallization (M_1st conductive segments) 242. VD contact structures 238 also represent a second type of fifth transistor-components. Via-to-gate (VG) contact structures 240 represent connections between gate lines 234 and M_1st conductive segments 242, and more specifically between MG contact structures 236 and M_1st conductive segments 242. M_1st conductive segments 242 are over corresponding gate lines 234 and MD contact structures 232. VG contact structures 240 also represent a third type of fifth transistor-components. Via structures in a first layer of interconnection (VIA_1st structures) 244 represent connections between corresponding M_1st conductive segments 242 and conductive segments in a second level of metallization (M_2nd conductive segments) 246. M_2nd conductive segments 246 are over corresponding M_1st conductive segments 242.

In some embodiments, depending upon the numbering convention of the corresponding process node by which such a semiconductor device is fabricated, the first (1st) layer of metallization M_1st is either metallization layer zero, M0, or metallization layer one, M1; and correspondingly the first layer of interconnection V_1st is either VIA0 or VIA1. In some embodiments, M0 is the first layer of metallization above a transistor layer (FIGS. 2K-2M). In some embodiments, the transistor layer includes components of transistors, e.g., ARs including S/D regions and channel regions therein, MD contact structures, VD contact structures, via-to-gate (VG) contact structures, gate structures, MG contact structures, or the like. In some embodiments, AR 230P is doped with a first conductivity-type dopant, and AR 230N are doped with a second conductivity-type dopant. In some embodiments that are configured according to complementary metal oxide semiconductor (CMOS) technology, the following is true: AR 230P is doped with a first conductivity-type dopant, e.g., a P-type dopant, such that the transistors corresponding to AR 230P are PFETs; AR 230N is doped with a second conductivity-type dopant, e.g., an N-type dopant, such that the transistors corresponding to AR 230N are NFETs; and AR 230P is formed in corresponding N-well (not shown).

Figure 2C:
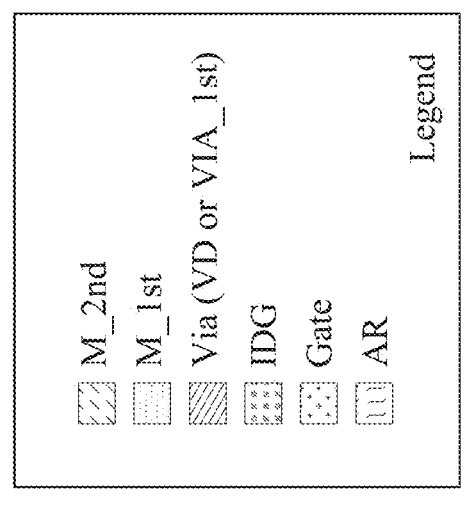
Figure 2C:
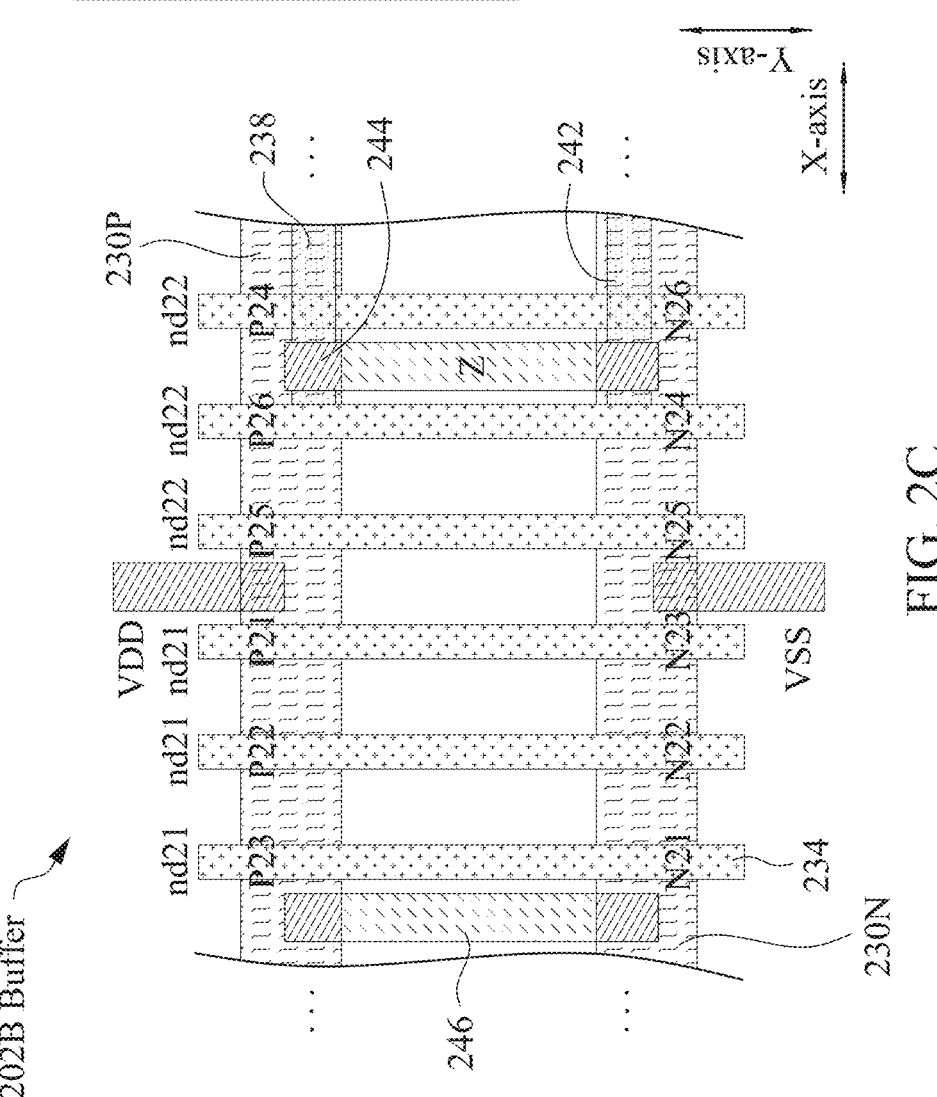

FIG. 2C is a layout diagram of buffer 202B which corresponds to buffer 202A of FIG. 2A, in accordance with some embodiments.

The layout diagram of FIG. 2C is a simplified version showing fewer shapes than the layout diagram of buffer 202B of FIG. 2B. FIG. 2C is provided for purposes of facilitating comparison with the layout diagram of FIG. 2E.

Figure 2D:
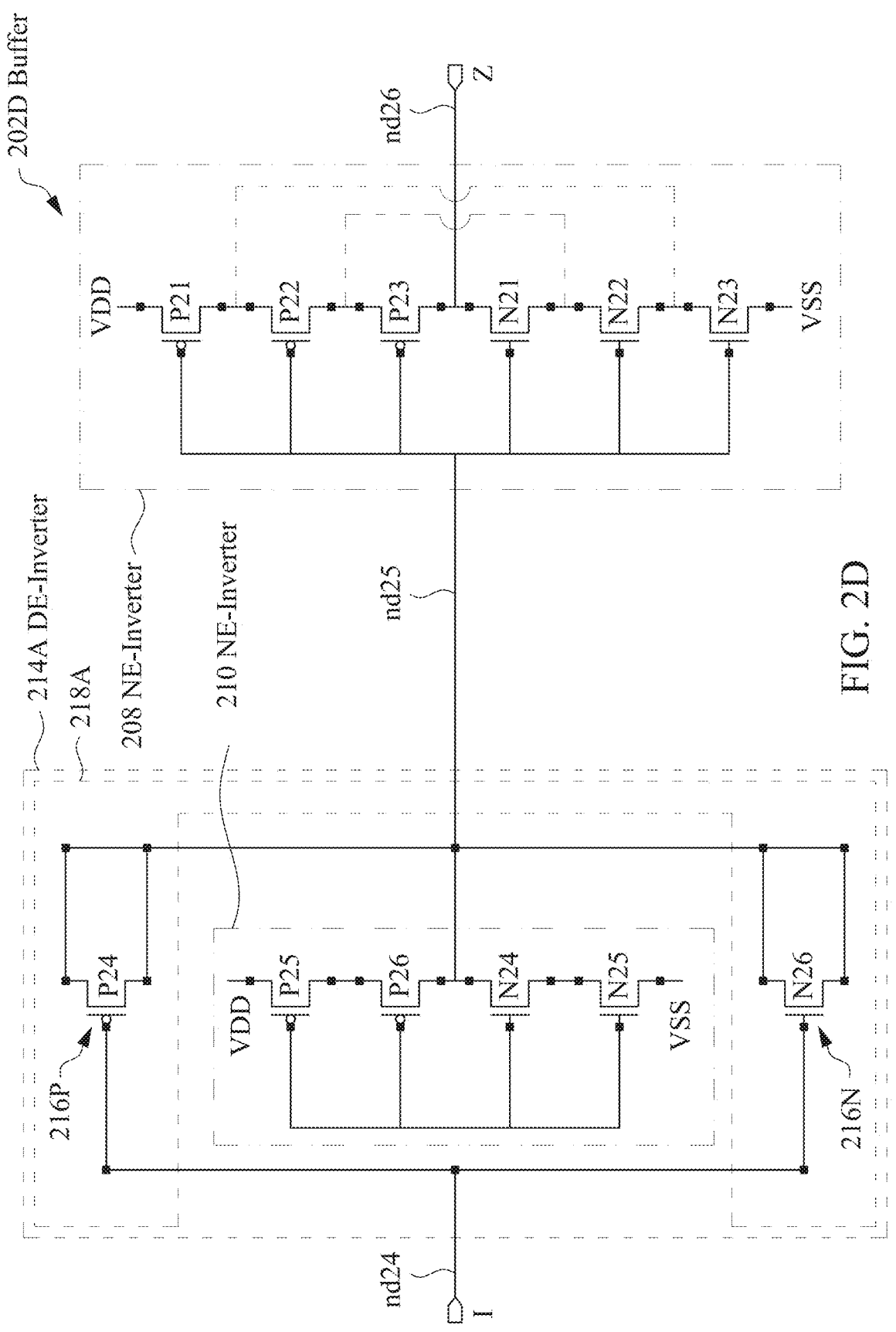
FIG. 2D is a schematic diagram of a circuit, in accordance with some embodiments.

FIG. 2D is a schematic diagram of a buffer circuit 202D, in accordance with some embodiments.

Buffer 202D is similar to buffer 202A in that each of buffers 202D and 202A includes NE-inverter 208 and DE-inverter 214A coupled in series. In some embodiments, buffer 202D is referred to as delay cell 202D. A semiconductor device having a buffer cell-region corresponding to buffer 202D is an example of buffer cell region 102(1) of FIG. 1.

Buffer 202D differs from buffer 202A in terms of the series arrangement of NE-inverter 208 and DE-inverter 214A. In buffer 202D, DE-inverter 214A precedes NE-inverter 208 whereas NE-inverter 208 precedes inverter 214A in buffer 202A of FIG. 2A.

In FIG. 2D, an input of buffer 202D is represented by a node nd24 which also represents an input of DE-inverter 214A. An output of DE-inverter 214A is represented by a node nd25 which also represents an input of NE-inverter 208. An output of NE-inverter 208 is represented by a node nd26 which also represents an output of buffer 202D.

Figure 2E:
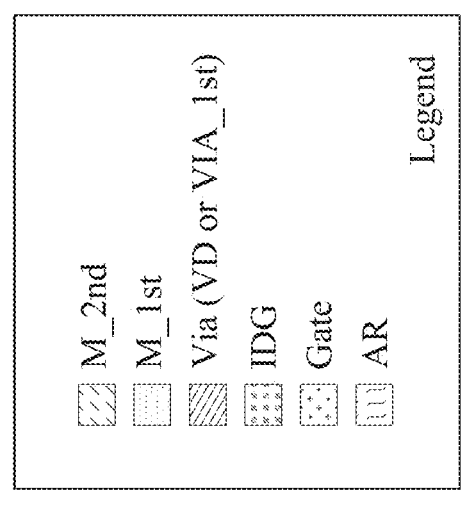
FIG. 2E is a layout diagram corresponding to the circuit of FIG. 2D, in accordance with some embodiments.
Figure 2E:
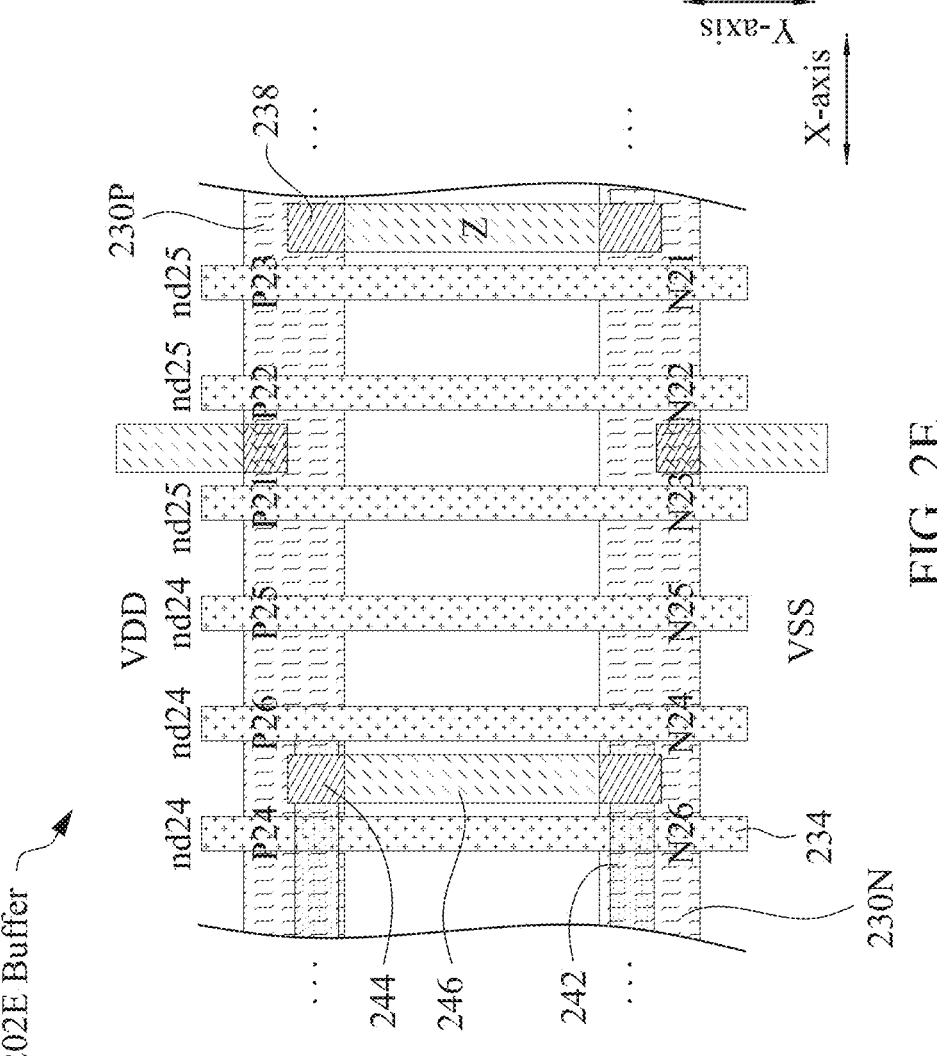

FIG. 2E is a layout diagram of buffer 202E which corresponds to buffer 202D of FIG. 2D, in accordance with some embodiments.

It is to be recalled: the series arrangement of buffer 202D of FIG. 2D has DE-inverter 214A preceding NE-inverter 208, and the layout diagram of buffer 202E corresponds to buffer 202D; and the series arrangement of buffer 202A of FIG. 2A has NE-inverter 208 preceding inverter 214A, and the layout diagram of buffer 202B of FIGS. 2B-2C corresponds to buffer 202A. Accordingly, the layout diagram of buffer 202E of FIG. 2E represents DE-inverter 214A as preceding NE-inverter 208 which is reflected, e.g., in the left-to-right arrangement of transistors P22-P26 and the left-to-right arrangement of transistors N22-N26 in FIG. 2E being different as compared to the corresponding left-to-right arrangement of transistors P22-P26 and left-to-right arrangement of transistors N22-N26 in FIGS. 2B-2C.

By exploiting the Miller Effect, buffer 202D achieves improved performance as compared to the buffer according to the other approach (as discussed above) without incurring a disadvantage of a larger footprint (area). Rather, as compared to the footprint (area) of the buffer according to the other approach, 6-stack NE-inverter exhibits substantially the same footprint, i.e., the footprint of 6-stack NE-inverter is not larger than the footprint of the buffer according to the other approach.

Figure 2F:
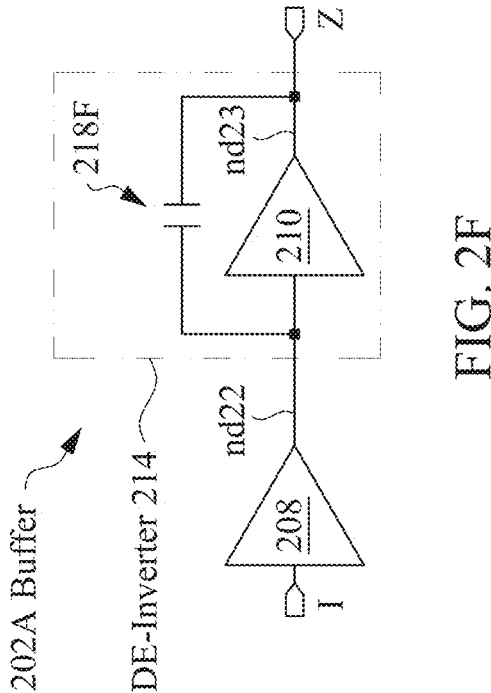
FIGS. 2F-2G are schematic diagrams corresponding to the circuit of FIG. 2A, in accordance with some embodiments.
Figure 2H:
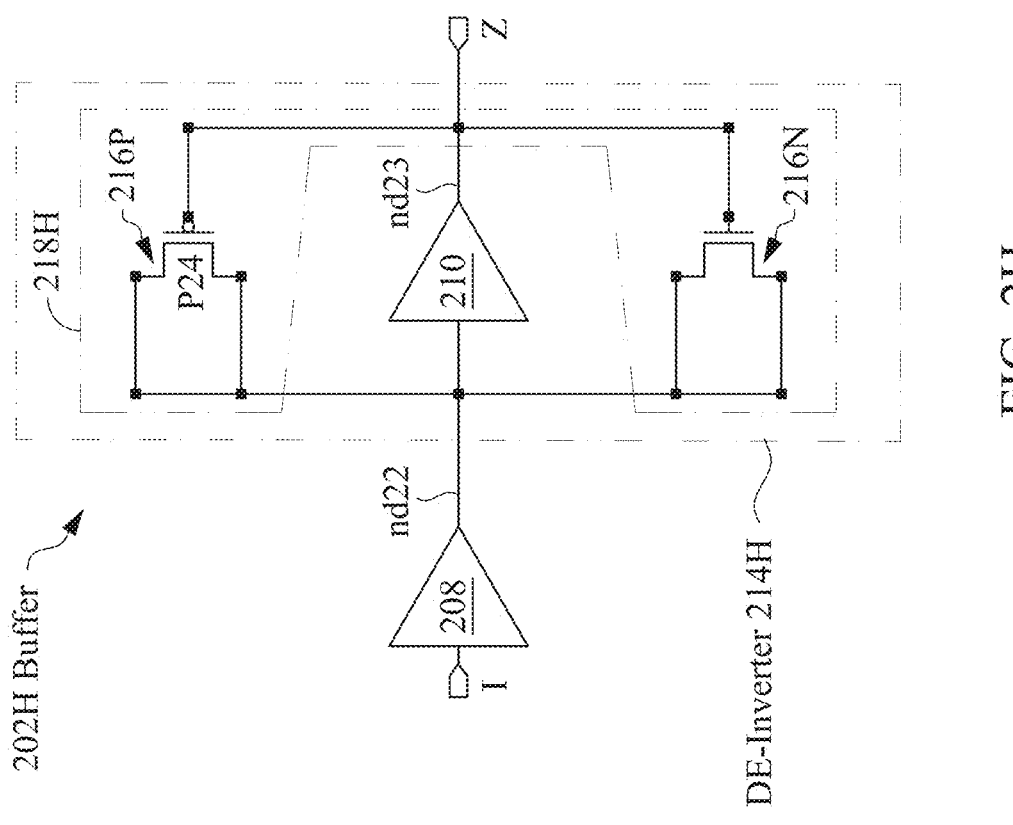
FIGS. 2H-2J are schematic diagrams, in accordance with some embodiments.

FIG. 2F is a schematic diagram of buffer 202A of FIG. 2A, in accordance with some embodiments.

The schematic diagram of FIG. 2F is a simplified version showing fewer shapes than the schematic diagram of buffer 202A of FIG. 2A. FIG. 2F is provided for purposes of representing DE-inverter 214A using simplified Miller-Configuration notation/symbology. Accordingly, FIG. 2F includes NE-inverter 208, NE-inverter 210 and capacitive device 218F.

Figure 2G:
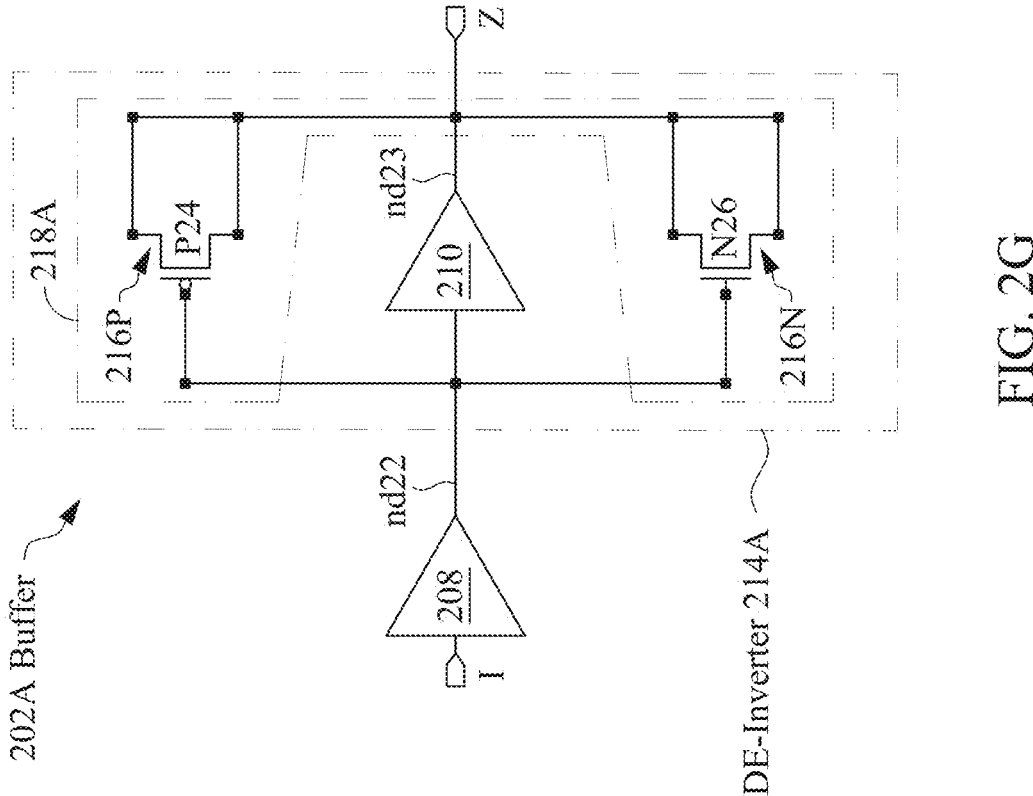
Figure 2J:
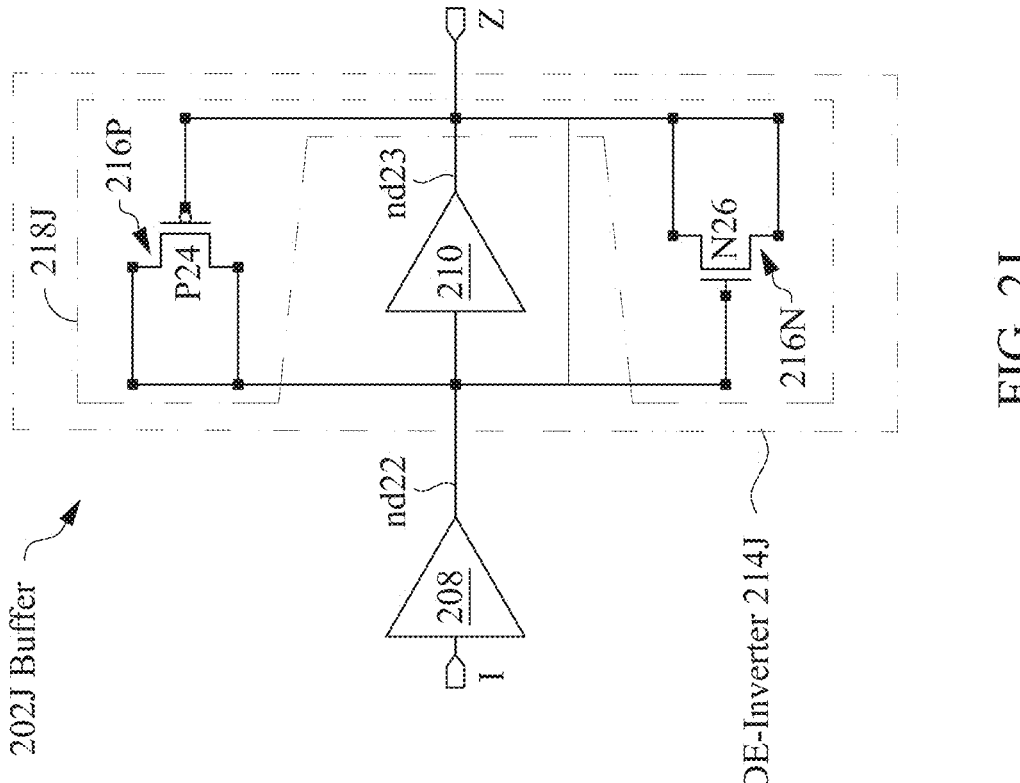

FIG. 2G is a schematic diagram of buffer 202A of FIG. 2A, in accordance with some embodiments.

The schematic diagram of FIG. 2G is a simplified version showing fewer shapes than of the schematic diagram of buffer 202A of FIG. 2A albeit less simplified, i.e., slightly more detailed than the schematic diagram of buffer 202A of FIG. 2F. FIG. 2G is provided for purposes of facilitating comparison with the schematic diagrams of FIGS. 2H-2J.

In FIG. 2G, within DE-inverter 214A, each of transistors P24 and N26 of capacitive device 218A has a gate-leading orientation.

More particularly, the capacitor-configuration of PFET P24 has a gate-leading orientation in which a gate terminal of PFET P24 is coupled to node n22 whereas first and second source/drain (S/D) terminals of PFET P24 are coupled to node n23.

The capacitor-configuration of NFET N26 has the gate-leading orientation in which a gate terminal of NFET N26 is coupled to node n22 whereas first and second S/D terminals of NFET N26 are coupled to node n23.

FIG. 2H is a schematic diagram of a buffer 202H, in accordance with some embodiments.

In FIG. 2H, the orientation of transistors P24 and N26 differs from their orientations in FIG. 2G. As a result, buffer 202H of FIG. 2H includes a DE-inverter 214H which includes a capacitive device 218H whereas buffer 202A of FIG. 2G includes DE-inverter 214A which includes capacitive device 218A.

In FIG. 2H, within DE-inverter 214H, each of transistors P24 and N26 of capacitive device 218H has a gate-following orientation.

More particularly, the capacitor-configuration of the PFET P24 has a gate-following orientation in which the gate terminal of the PFET P24 is coupled to node nd23 whereas the first and second S/D terminals of PFET P24 are coupled to node nd22.

The capacitor-configuration of NFET N26 has the gate-following orientation in which the gate terminal of NFET N26 is coupled to nd23 whereas the first and second S/D terminals of NFET N24 are coupled to node nd22.

Figure 2I:
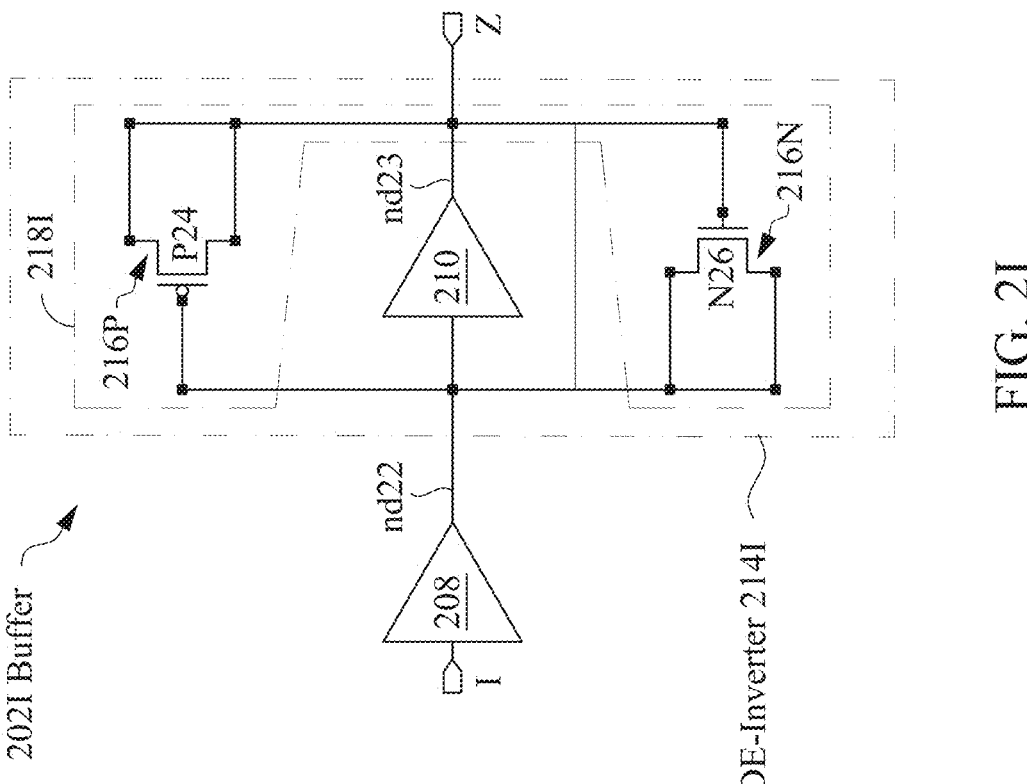
Figures 2K, 2L:
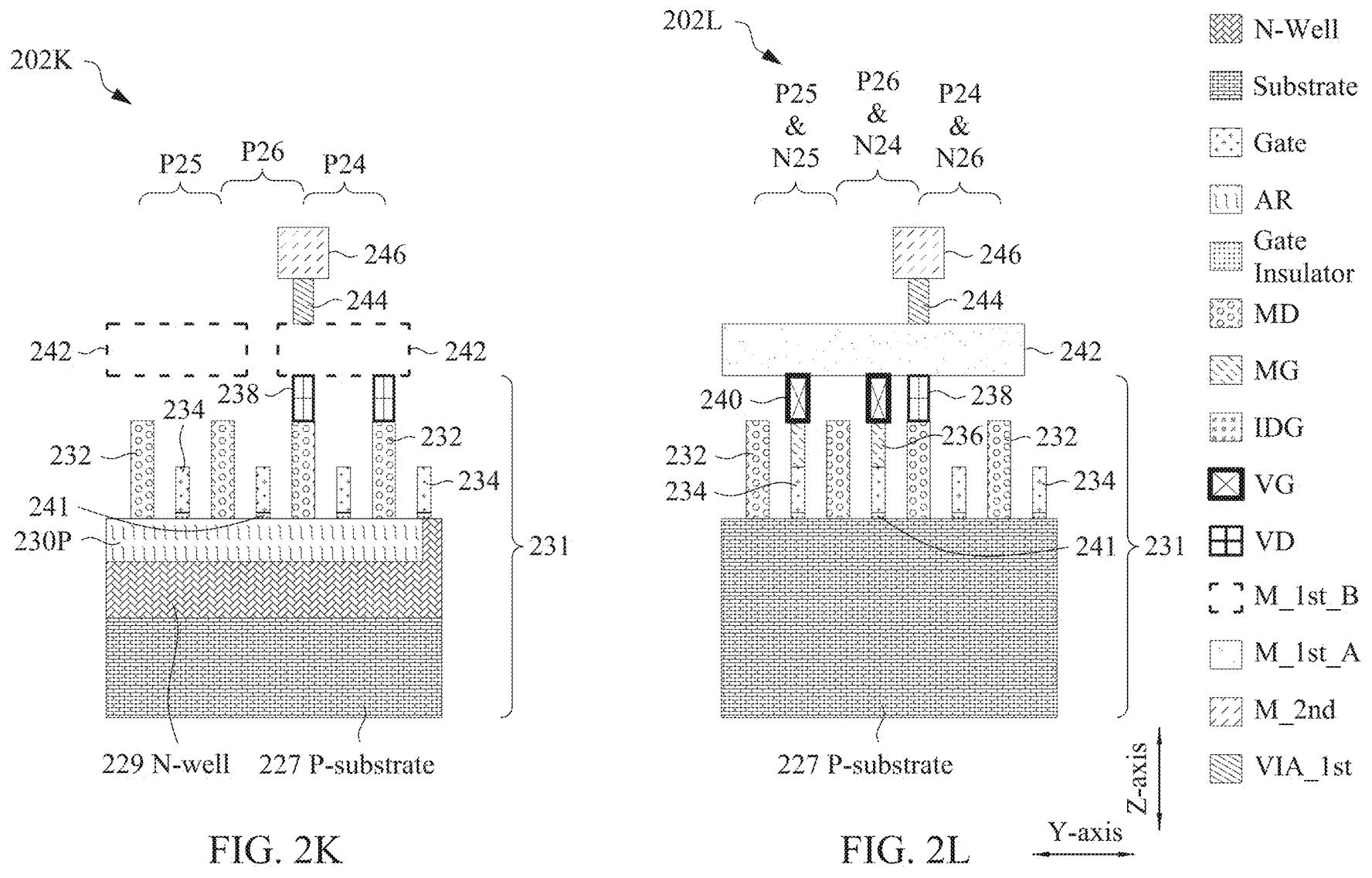
Figure 2M:
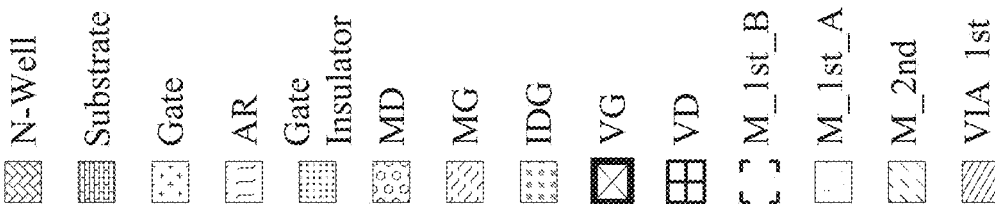
Figure 2M:
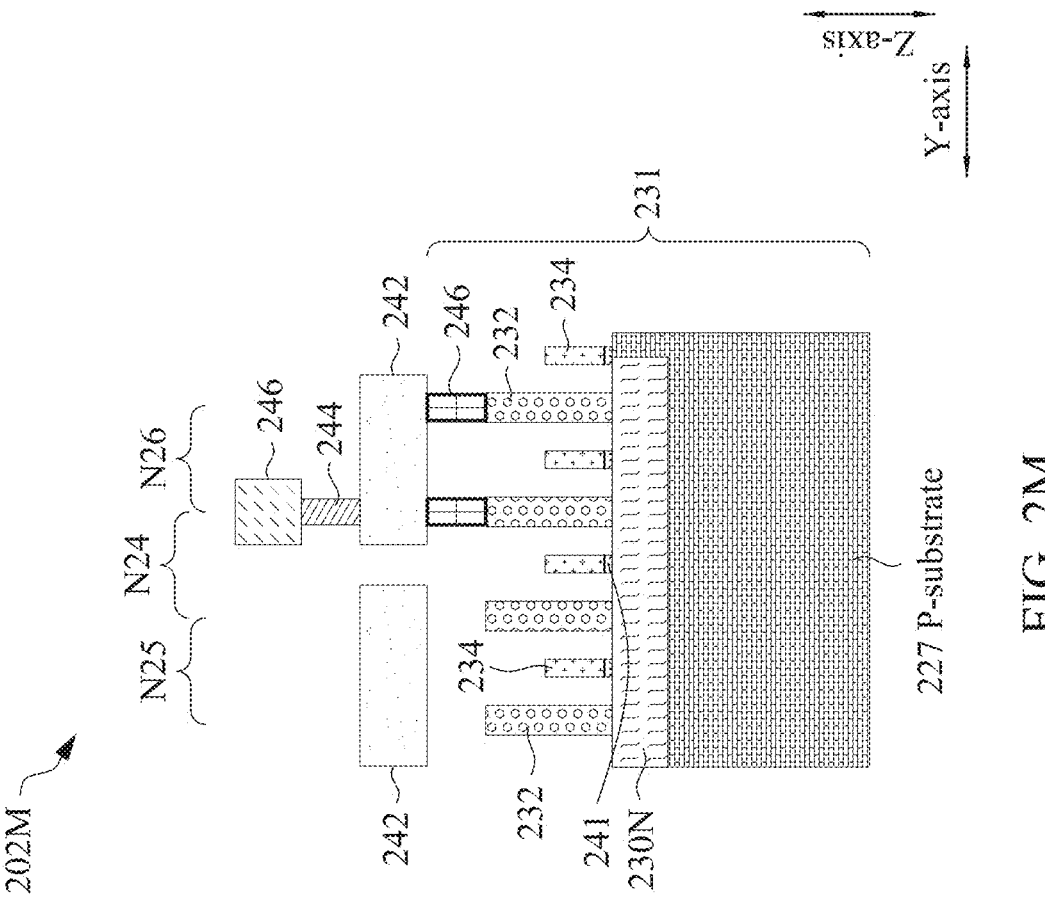

FIG. 2I is a schematic diagram of a buffer 202I, in accordance with some embodiments.

In FIG. 2I, the orientation of transistor N26 differs from the orientation of transistor N26 in FIG. 2G. As a result, buffer 202I of FIG. 2I includes a DE-inverter 214I which includes a capacitive device 218I whereas buffer 202A of FIG. 2G includes DE-inverter 214A which includes capacitive device 218A.

In FIG. 2I, within DE-inverter 214H, transistor P24 the gate-leading orientation of transistor P24 in FIG. 2G whereas transistor N26 has the gate-following orientation of transistor N26 of FIG. 2H.

FIG. 2J is a schematic diagram of a buffer 202J, in accordance with some embodiments.

In FIG. 2J, the orientation of transistor P24 differs from the orientation of transistor P24 in FIG. 2G. As a result, buffer 202J of FIG. 2J includes a DE-inverter 214J which includes a capacitive device 218J whereas buffer 202A of FIG. 2G includes DE-inverter 214A which includes capacitive device 218A.

In FIG. 2J, within DE-inverter 214J, transistor P24 has the gate-following orientation of transistor P24 in FIG. 2H whereas transistor N26 has the gate-leading orientation of transistor N26 of FIG. 2G.

FIGS. 2K-2M are cross-sectional diagrams of corresponding buffers 202K-202M, in accordance with some embodiments.

Buffer 202K of FIG. 2K corresponds to section line 2K-2K' in FIG. 2B. Buffer 202L of FIG. 2L corresponds to section line 2L-2L' in FIG. 2B. Buffer 202M of FIG. 2M corresponds to section line 2M-2M' in FIG. 2B.

In addition to the components shown in FIG. 2B, each of FIGS. 2K-2M further includes: a P-type substrate 227; and gate insulator segments 241 between ARs 230P and 230N and corresponding gate structures 234. In addition to the components shown in FIG. 2B, FIG. 2K further includes an N-well in which is formed AR 230P. In each of FIGS. 2K-2M, a transistor layer 231 includes: P-type substrate 227; N-well 229 (FIG. 2K); gate insulator segments 241; gate structures 234; MD contact structures 232; MG contact structures 236; VG contact structures 240; and VD contact structures 238.

Again, MG structures 236, VD contact structures 238 and VG contact structures 240 represent corresponding first, second and third types of fifth transistor-components. The fifth transistor-components selectively connect: a first set of the first to fourth transistor-components as corresponding switching-configured transistors P25-P26 and N24-N25; and a second set of the first to fourth transistor-components as corresponding non-switching-configured transistors P24 and N26.

M_1st conductive segments 242, and selectively VIA_1st structures 244 and M_2nd conductive segments 246, connect: switching-configured transistors P25-P26 & N24-N25 as NE-inverter 208 having an output at node nd23 and an input at node nd22; and non-switching-configured transistors P24 & N26 as capacitive device 218 which is feedback-coupled between node nd23 and node nd22.

Figure 3A:
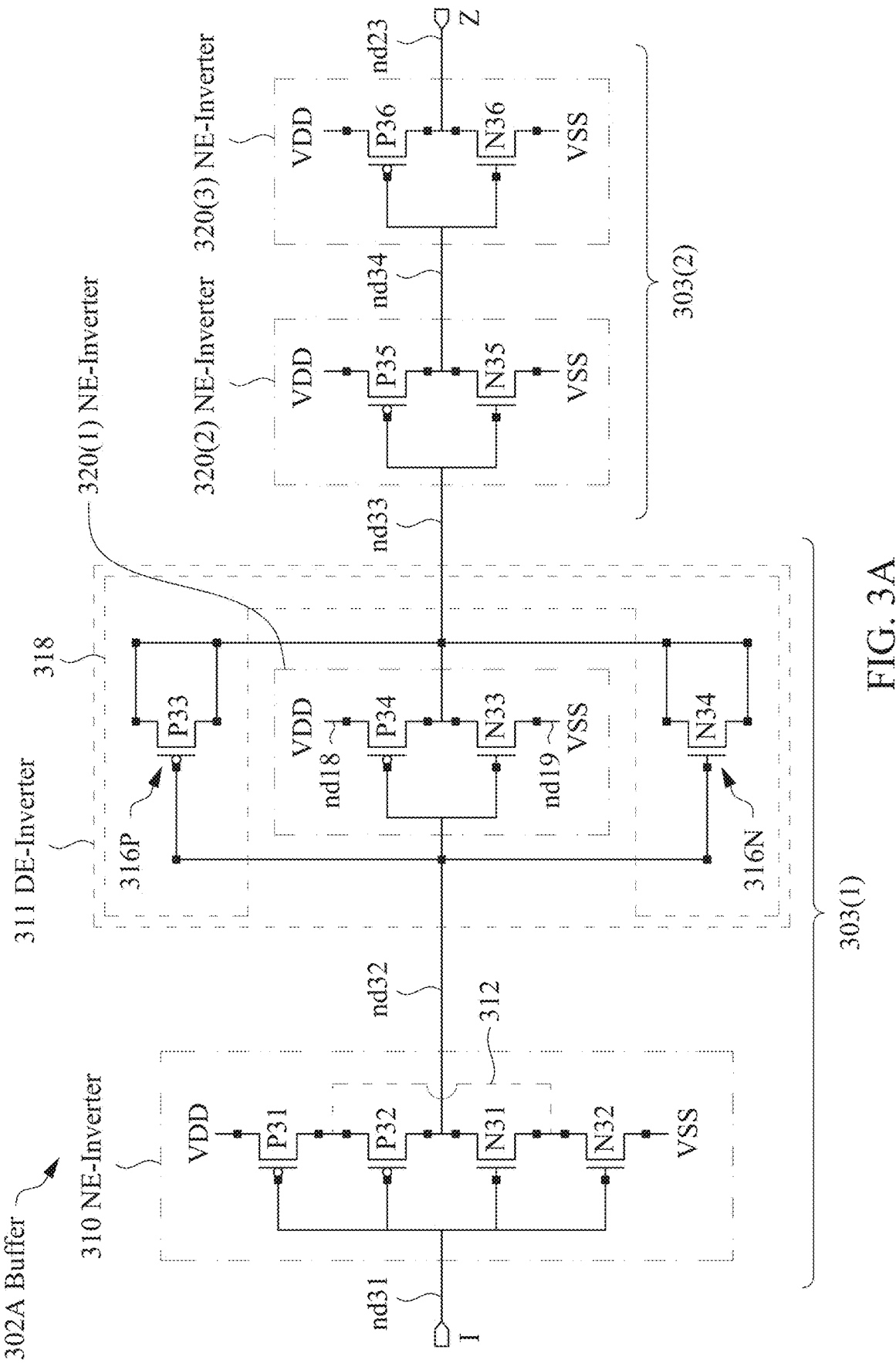
FIG. 3A is a schematic diagram of a circuit, in accordance with some embodiments.

FIG. 3A is a schematic diagram of a buffer 302A, in accordance with some embodiments.

Buffer 302A includes an NE-inverter 310, a DE-inverter 311 and NE-inverters 320(2) and 320(3). NE-inverter 310 includes anti-float shunt 312. In some embodiments, buffer 302A is referred to as delay cell 302A. A semiconductor device having a buffer cell-region corresponding to buffer 302A is an example of buffer cell region 102(1) of FIG. 1. Buffer 302A includes 6 PFETs and 6 NFETs for a total of 12 FETs.

In FIG. 3A, an input of buffer 302A is represented by a node nd31 which also represents an input of NE-inverter 310. An output of NE-inverter 310 is represented by a node nd32 which also represents an input of DE-inverter 311, i.e., DE-inverter 311 is coupled in series with NE-inverter 310. An output of DE-inverter 311 is represented by a node nd33 which also represents an input of NE-inverter 320(2), i.e., NE-inverter 320(2) is coupled in series with DE-inverter 311. An output of NE-inverter 320(2) is represented by a node nd34 which also represents an input of NE-inverter 320(3), i.e., NE-inverter 320(3) is coupled in series with NE-inverter 320(2). Node nd35 also represents an output of buffer 302A.

NE-inverter 310 includes PFETs P31 and P32 and NFETs N31 and N32 coupled in series between a first reference voltage and a second reference voltage. In some embodiments, the first reference voltage is VDD and the second reference voltage is VSS. Transistors P31-P32 are coupled in series between VDD and node nd32. Transistors N31-N32 are coupled in series between node nd32 and VSS. NE-inverter 310 of FIG. 3A is similar to NE-inverter 208 of FIG. 2A except that NE-inverter 310 includes four FETs whereas NE-inverter 208 includes six FETs. In some embodiments, NE-inverter 310 is described as a four-stack inverter, i.e., is described as having a stack of four transistors. In some embodiments, buffer 302A is described as having four stages corresponding to NE-inverter 310, DE-inverter 311, NE-inverter 320(2) and NE-inverter 320(3). In some embodiments, NE-inverter 310 is a float-resistant inverter that includes an anti-float shunt.

In FIG. 3A, DE-inverter 311 includes an NE-inverter 320(1) and a capacitive device 318, where capacitive device 318 is feedback-coupled between nodes nd33 and nd32. NE-inverter 320(1) includes PFET P34 and NFET N33 in series between VDD and VSS. Transistor P34 is coupled between VDD and node nd33. Transistor N33 is coupled between node nd33 and VSS. In some embodiments, NE-inverter 320(1) is described as a two-stack inverter, i.e., is described as having a stack of two transistors.

Capacitive device 318 includes capacitive components 316P and 316N, each of which is feedback-coupled between nodes nd33 and nd32. Capacitive component 316P includes a PFET P33 having a capacitor-configuration. A gate terminal of transistor P33 is coupled to node nd32. Both S/D terminals of transistor P33 are coupled to node nd33. Capacitive component 316N includes an NFET N34 having a capacitor-configuration. A gate terminal of transistor N34 is coupled to node nd32. Both S/D terminals of transistor N34 are coupled to node nd33. Each of capacitor-configured transistors P33 and N34 has the gate-leading orientation similar to FIG. 2G. In some embodiments, capacitor-configured transistors P33 and N34 variously have the PFET and NFET orientations of FIG. 2H, 2I or 2J, or the like. In total, DE-inverter 311 includes six transistors. In light of transistors P33 and N34 being capacitor-configured, in some embodiments, DE-inverter 311 is described as a two-stack inverter.

In FIG. 3A, NE-inverter 320(2) includes PFET P35 and NFET N35 in series between VDD and VSS. Transistor P35 is coupled between VDD and node nd34. Transistor N35 is coupled between node nd34 and VSS. In some embodiments, NE-inverter 320(2) is described as a two-stack inverter.

NE-inverter 320(3) includes PFET P36 and NFET N36 in series between VDD and VSS. Transistor P36 is coupled between VDD and node nd35. Transistor N36 is coupled between node nd35 and VSS. In some embodiments, NE-inverter 320(3) is described as a two-stack inverter.

According to the first other approach, a buffer representing a counterpart to buffer 302A has 6 PFETs and 6 NFETs none of which is an NS_FET. An inverter of the first other approach's buffer which represents a counterpart to DE-inverter 311 is not arranged with a capacitive device in a feedback-coupling with respect to the inverter, i.e., does not have a counterpart to capacitive device 318, but instead is arranged as a 4-stack NE-inverter. In terms of various performance parameters, the buffer according to the first other approach was compared against buffer 302A for the same set of conditions. Among other things, as compared to the buffer according to the first other approach: buffer 302A exhibits a reduction in power consumption of about 45.7%; buffer 302A exhibits a reduction in leakage power of about 22.7%;

According to a second other approach, a buffer representing a counterpart to buffer 202A has 6 PFETs and 6 NFETs arranged in two stages of which none of the transistors is an NS_FET (discussed below). An inverter of the second other approach's buffer which represents a counterpart to DE-inverter 214A is not arranged with a capacitive device in a feedback-coupling with respect to the inverter, i.e., does not have a counterpart to capacitive device 218A, but instead is arranged as a 4-stack NE-inverter. In terms of various performance parameters, the buffer according to the second other approach was compared against buffer 202A for the same set of conditions. Among other things, as compared to the buffer according to the second other approach, buffer 302A exhibits reduced variation in delay, D, in a range D≤(≈12.4%).

By exploiting the Miller Effect, buffer 302A achieves improved performance as compared to the buffer according to the other approach (as discussed above) without incurring a disadvantage of a larger footprint (area). Rather, as compared to footprint (area) of the buffer according to the other approach, buffer 302A exhibits substantially the same footprint, i.e., the footprint of buffer 302A is not larger than the footprint of the buffer according to the other approach.

In FIG. 3A, in some embodiments, DE-inverter 311 is described in terms of SW_FETs and NS_FETs. In DE-inverter 311: transistors P34 and N33 are SW_FETs whereas transistors P33 and N34 are NS_FETs; and the number of SW_FETs is CSW=2, which is equal to the number of NS_FETs, where CNS=2. In DE-inverter 311: the sum of the number of SW_FETs and NS_FETs is $\Sigma$=CSW+CNS=4; a ratio of the number of the NS_FETs divided by the sum is CNS/$\Sigma$=0.5; and a ratio of the number of the SW_FETs divided by the sum is CSW/$\Sigma$=0.5.

In some embodiments, buffer 302A is described as including buffering units 303(1) and 303(2). Buffering unit 303(1) includes NE-inverter 310 and DE-inverter 311. Buffering unit 303(2) includes NE-inverters 320(2) and 320(3).

In FIG. 3A, in some embodiments, buffering unit 303(1) is described in terms of SW_FETs and NS_FETs. In buffering unit 303(1): transistors P31-P32, P34 and N31-N33 are SW_FETs whereas transistors P33 and N34 are NS_FETs; and the number of SW_FETs is CSW=6, which is greater than the number of NS_FETS, where CNS=2. In buffering unit 303(1): the sum of the number of SW_FETs and NS_FETs is $\Sigma$=8; a ratio of the number of the NS_FETs divided by the sum of the number of SW_FETs and NS_FETs is CNS/$\Sigma$=0.25; and a ratio of the number of the SW_FETs divided by the sum is CSW/$\Sigma$=0.75.

In some embodiments, buffering unit 303(2) is described in terms of SW_FETs and NS_FETs. In buffering unit 303(2): transistors P35-P36 and N35-N36 are SW_FETs whereas no transistors NS_FETs; and the number of SW_FETs is CSW=4, which is greater than the number of NS_FETS, where CNS=0. In buffering unit 303(2): the sum of the number of SW_FETs and NS_FETs is $\Sigma$=4; a ratio of the number of the NS_FETs divided by the sum of the number of SW_FETs and NS_FETs is CNS/$\Sigma$=0.0; and a ratio of the number of the SW_FETs divided by the sum is CSW/$\Sigma$=1.

In FIG. 3A, in some embodiments, buffer 302A is described in terms of SW_FETs and NS_FETs. In buffer 302A: transistors P31-P32, P34-P36, N35-N36 are SW_FETs whereas transistors P33 and N34 are NS_FETs; and the number of SW_FETs is CSW=10, which is greater than the number of NS_FETS, where CNS=2. In buffer 302A: the sum of the number of SW_FETs and NS_FETs is $\Sigma$=12; a ratio of the number of the NS_FETs divided by the sum of the number of SW_FETs and NS_FETs is CNS/$\Sigma$=1/6; and a ratio of the number of the SW_FETs divided by the sum is CSW/$\Sigma$=5/6.

Figure 3B:
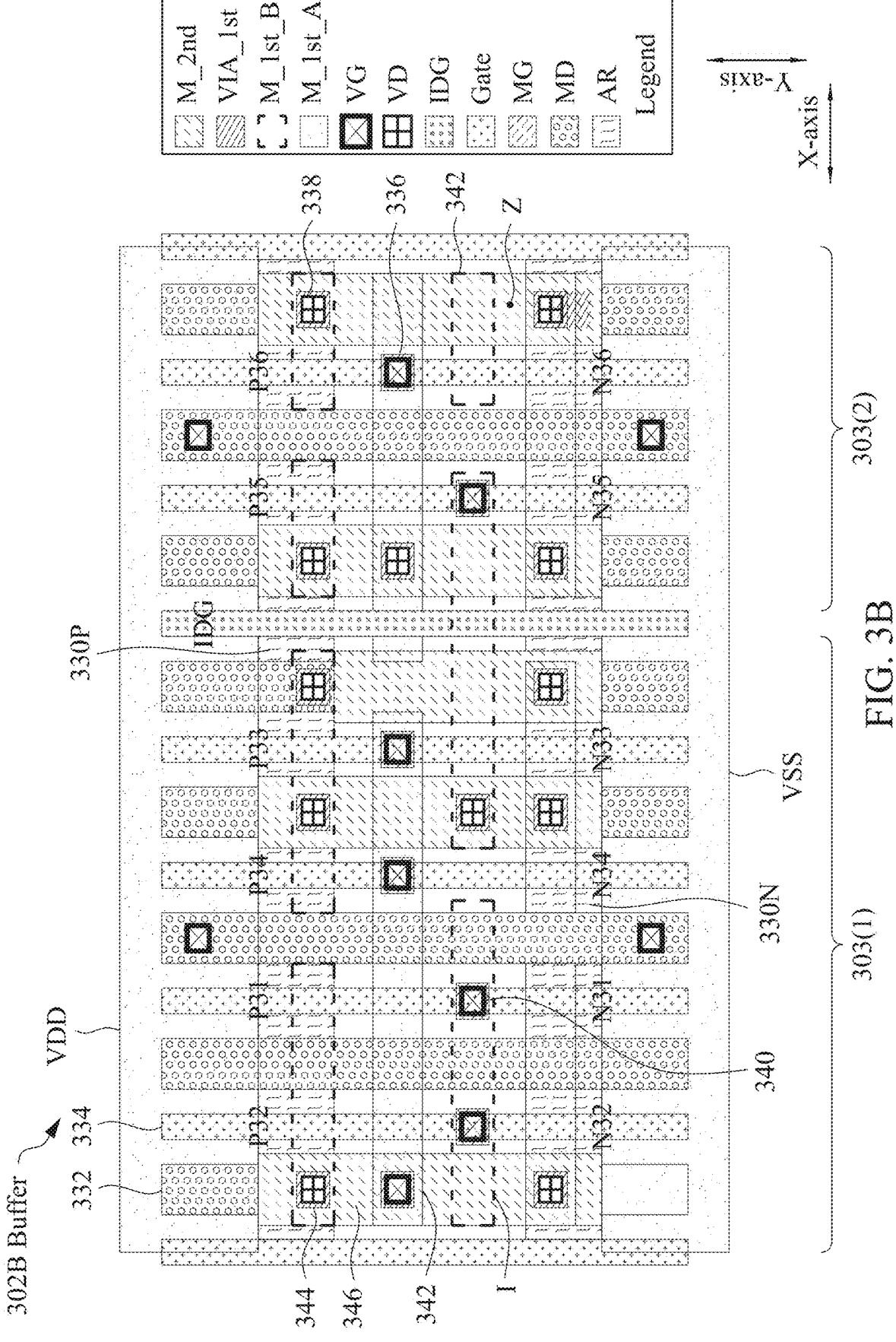
FIGS. 3B-3C are layout diagrams corresponding to the circuit of FIG. 3A, in accordance with some embodiments.

FIG. 3B is a layout diagram of buffer 302B which corresponds to buffer 302A of FIG. 3A, in accordance with some embodiments.

A semiconductor device having a buffer cell-region based on buffer 302B is an example of buffer cell region 102(1) of FIG. 1. General locations of PFETs P31-P36 and NFETs N31-N36 are shown in FIG. 3B.

The layout diagram of FIG. 3B is similar to the layout diagram of FIG. 2B. For purposes of brevity, discussion of aspects of FIG. 3B which are similar to aspects of FIG. 2B will be shortened or omitted.

In FIG. 3B, buffer 302B includes an active region (AR) 330P which is configured for PMOS technology and an AR 330N which is configured for NMOS technology. ARs 330P and 330N include doped first areas that represent source/drain (S/D) regions (not shown) of the ARs. The S/D regions represent first transistor-components. Second areas of ARs 330P and 330N which are between corresponding S/D regions are channel regions (not shown) that represent second transistor-components.

Gate lines 334 are over corresponding ones of the channel regions. Gate lines 334 represent third transistor-components. MD contact structures 332 are over corresponding ones of the S/D regions. MD contact structures 332 represent fourth transistor-components. In some embodiments, a given S/D region is formed by doping a portion of an AR that is between corresponding instances of gate lines 334 or that is adjacent to a corresponding instance of an IDG (discussed below) with an appropriate conductivity-type dopant. MG contact structures 336 are over corresponding ones of gate lines 334. In some embodiments, MG contact structures 336 represent a first type of fifth transistor-components.

VD contact structures 338 represent connections between corresponding MD contact structures 332 and M_1st conductive segments 342. VD contact structures 338 also represent a second type of fifth transistor-components. VG contact structures 340 represent connections between gate lines 334 and M_1st conductive segments 342, and more specifically between MG contact structures 336 and M_1st conductive segments 342. M_1st conductive segments 342 are over corresponding gate lines 334 and MD contact structures 332. VG contact structures 340 also represent a third type of fifth transistor-components. VIA_1st structures 344 represent connections between corresponding M_1st conductive segments 342 and M_2nd conductive segments 346. M_2nd conductive segments 346 are over corresponding M_1st conductive segments 342.

In FIG. 3B, an instance of gate line 340 has been replaced by an insulating dummy gate (IDG) 248. An isolation dummy gate, such as that created from isolation dummy gate pattern 248, is a dielectric structure that includes one or more dielectric materials and functions as an electrical isolation structure. Accordingly, an isolation dummy gate is not a structure that is electrically conductive and so does not function, e.g., as a gate electrode of an active transistor. In some embodiments, an isolation dummy gate is referred to as a dielectric gate structure. In some embodiments, an isolation dummy gate is an example of a structure included in CPODE layout scheme. In some embodiments, CPODE is an acronym for continuous poly on diffusion edge. In some embodiments, CPODE is an acronym for continuous poly on oxide definition edge. In some embodiments, an isolation dummy gate is based on a gate structure as a precursor. In some embodiments, an isolation dummy gate is formed by first forming a gate structure, e.g., a dummy gate structure, sacrificing/removing (e.g., etching) the gate structure to form a trench, (optionally) removing a portion of a substrate that previously had been under the gate structure to deepen the trench, and then filling the trench with one or more dielectric materials such that the physical dimensions of the resultant electrical isolation structure, i.e., the isolation dummy gate, are similar to the dimensions of the precursor which was sacrificed, namely the gate structure or the combination of the gate structure and the portion of the substrate.

Figure 3C:
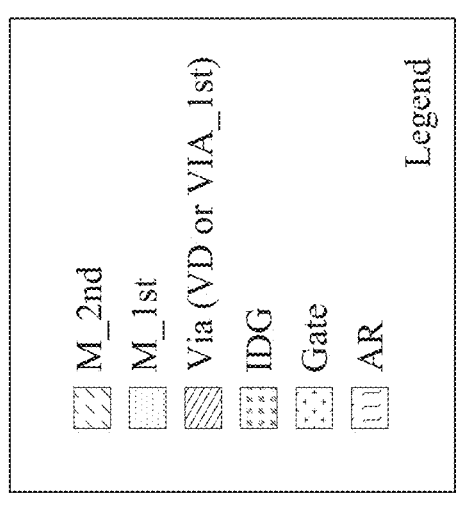
Figure 3C:
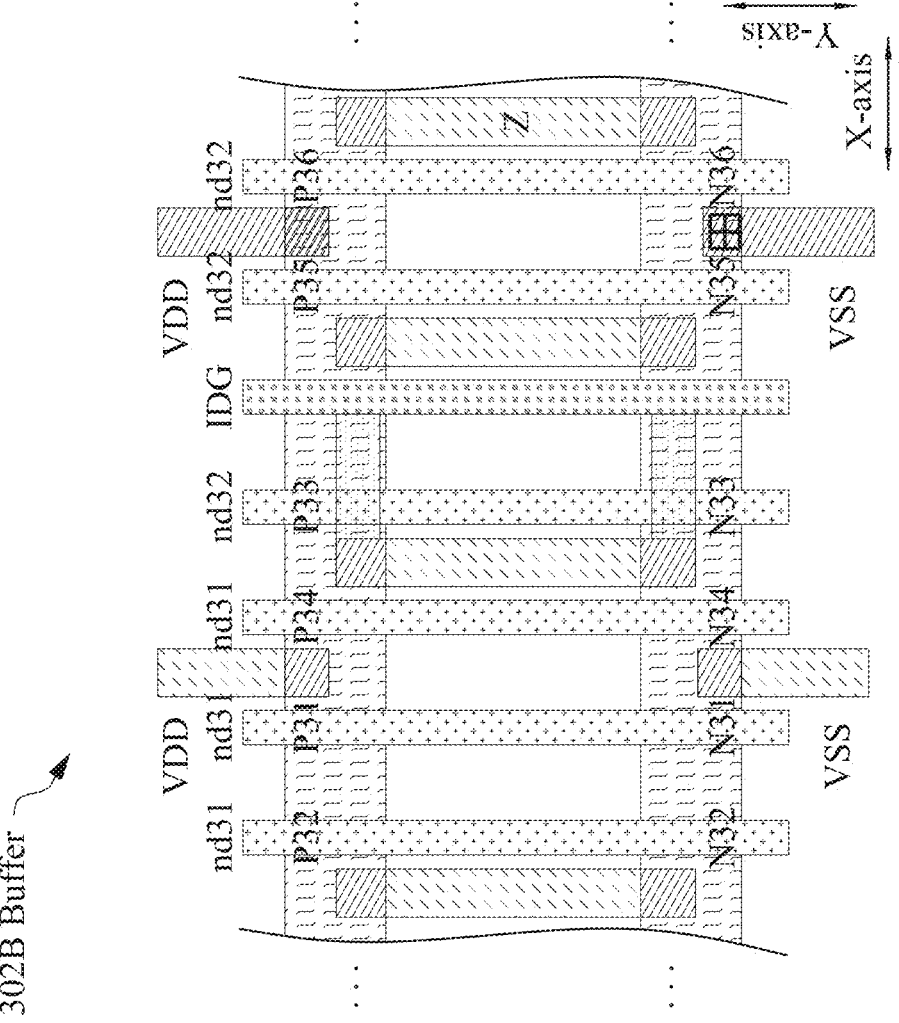

FIG. 3C is a layout diagram of buffer 302B which corresponds to buffer 302A of FIG. 3A, in accordance with some embodiments.

The layout diagram of FIG. 3C is a simplified version showing fewer shapes than the layout diagram of buffer 302B of FIG. 3B. FIG. 3C is provided for purposes of facilitating comparison with the layout diagram of FIG. 3D.

Figure 3D:
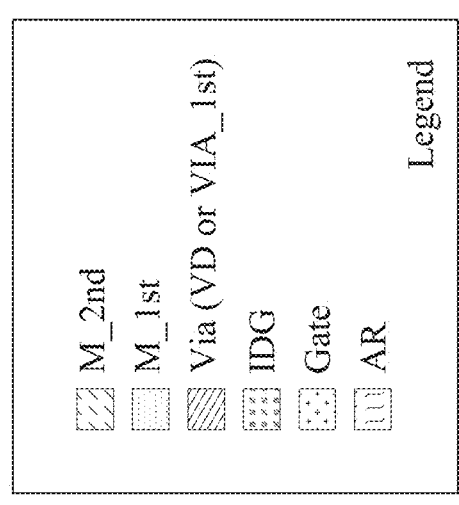
FIG. 3D is a layout diagram, in accordance with some embodiments.
Figure 3D:
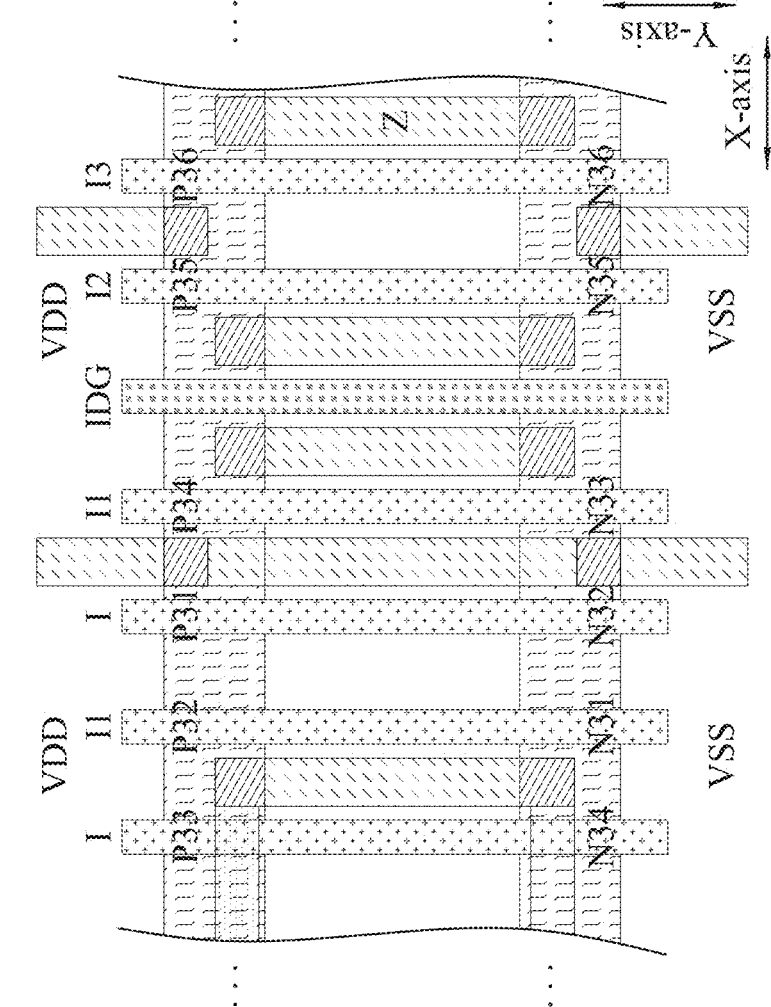

FIG. 3D is a layout diagram of buffer 302E which represents a variation of buffer 302B of FIGS. 3B-3C, in accordance with some embodiments.

The schematic diagram (not shown) represented by buffer 302D is similar to buffer 302A in that each of the variation schematic diagram (not shown) and buffer 302A includes NE-inverter 310 and DE-inverter 311 coupled in series. In some embodiments, buffer 302D is referred to as delay cell 302D. A semiconductor device having a buffer cell-region corresponding to buffer 302D is an example of buffer cell region 102(1) of FIG. 1.

Regarding FIG. 3D, the schematic diagram (not shown) represented by buffer 302D differs from buffer 302A in terms of the series arrangement of NE-inverter 310 and DE-inverter 311. In the variation schematic diagram (not shown) represented by buffer 302D, DE-inverter 311 precedes NE-inverter 310 whereas NE-inverter 310 precedes DE-inverter 311 in buffer 302A of FIG. 3A. Accordingly, the layout diagram of buffer 302D of FIG. 3D represents DE-inverter 311 as preceding NE-inverter 310 which is reflected, e.g., in the left-to-right arrangement of transistors P31-P36 and the left-to-right arrangement of transistors N31-N36 in FIG. 3D being different as compared to the corresponding left-to-right arrangement of transistors P31-P36 and left-to-right arrangement of transistors N31-N36 in FIGS. 3B-3C.

Figure 4A:
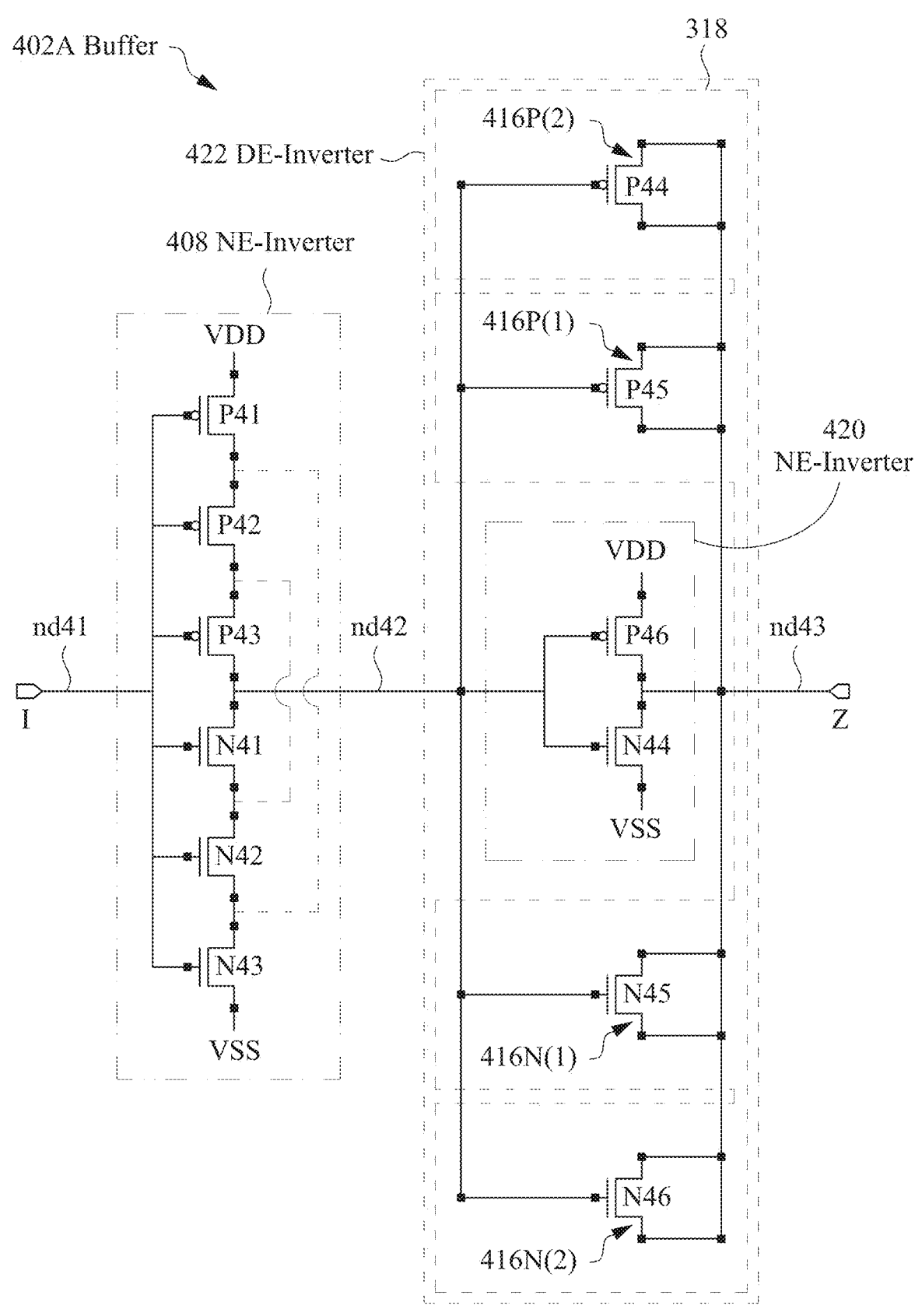
FIG. 4A is a schematic diagram of a circuit, in accordance with some embodiments.

FIG. 4A is a schematic diagram of a buffer 402A, in accordance with some embodiments.

Buffer 402A includes an NE-inverter 408 and a DE-inverter 422. In some embodiments, buffer 402A is referred to as delay cell 402A. A semiconductor device having a buffer cell-region corresponding to buffer 402A is an example of buffer cell region 102(1) of FIG. 1. Buffer 402A includes 6 PFETs and 6 NFETs for a total of 12 FETs.

In FIG. 4A, an input of buffer 402A is represented by a node nd41 which also represents an input of NE-inverter 408. An output of NE-inverter 408 is represented by a node nd42 which also represents an input of DE-inverter 422, i.e., DE-inverter 422 is coupled in series with NE-inverter 408. An output of DE-inverter 422 is represented by a node nd43 which also represents an output of buffer 402A.

NE-inverter 408 includes PFETs P41-P43 and NFETs N41-N43 coupled in series between a first reference voltage and a second reference voltage. In some embodiments, the first reference voltage is VDD and the second reference voltage is VSS. Transistors P41-P43 are coupled between VDD and node nd42. Transistors N41-N43 are coupled in series between node nd42 and VSS. NE-inverter 408 of FIG. 4A is similar to NE-inverter 208 of FIG. 2A in that each includes six FETs. In some embodiments, NE-inverter 408 is described as a six-stack inverter. In some embodiments, buffer 402A is described as having two stages corresponding to NE-inverter 408 and DE-inverter 422. In some embodiments, NE-inverter 408 is a float-resistant inverter that includes an anti-float shunt.

In FIG. 4A, DE-inverter 422 includes an NE-inverter 420 and a capacitive device 318, where capacitive device 318 is feedback-coupled between nodes nd43 and nd42. NE-inverter 420 includes PFET P44 and NFET N43 in series between VDD and VSS. Transistor P44 is coupled between VDD and node nd43. Transistor N43 is coupled between node nd43 and VSS. In some embodiments, NE-inverter 420 is described as a two-stack inverter, i.e., is described as having a stack of two transistors.

Capacitive device 318 includes capacitive components 416P(1)-416P(2) and 416N(1)-416N(2), each of which is feedback-coupled between nodes nd43 and nd42. Capacitive component 416P(1) includes a PFET P45 having a capacitor-configuration. A gate terminal of transistor P45 is coupled to node nd42. Both S/D terminals of transistor P45 are coupled to node nd43. Capacitive component 416P(2) includes a PFET P44 having a capacitor-configuration. A gate terminal of transistor P44 is coupled to node nd42. Both S/D terminals of transistor P44 are coupled to node nd43. Capacitive component 416N(1) includes an NFET N45 having a capacitor-configuration. A gate terminal of transistor N45 is coupled to node nd42. Both S/D terminals of transistor N45 are coupled to node nd43. Capacitive component 416N(2) includes an NFET N46 having a capacitor-configuration. A gate terminal of transistor N46 is coupled to node nd42. Both S/D terminals of transistor N46 are coupled to node nd43.

Each of capacitor-configured transistors P44-P45 and N45-N46 has the gate-leading orientation similar to FIG. 2G. In some embodiments, capacitor-configured transistors P44-P45 and N45-N46 variously have the PFET and NFET orientations of FIG. 2H, 2I or 2J, or the like. In some embodiments, capacitor-configured transistors P44-P45 have different orientations. In some embodiments, capacitor-configured transistors N45-N46 have different orientations.

In total, DE-inverter 422 includes six transistors. In light of transistors P44-P45 and N45-N46 being capacitor-configured, in some embodiments, DE-inverter 422 is described as a four-stack inverter.

According to the first other approach, a buffer representing a counterpart to buffer 402A has 6 PFETs and 6 NFETs none of which is an NS_FET. An inverter of the first other approach's buffer which represents a counterpart to NE-inverter 420 is not arranged with a capacitive device in a feedback-coupling with respect to the inverter, i.e., does not have a counterpart to capacitive device 418, but instead is arranged as a 6-stack NE-inverter. In terms of various performance parameters, the buffer according to the first other approach was compared against buffer 402A for the same set of conditions. Among other things, as compared to the buffer according to the first other approach: buffer 402A exhibits a reduction in power consumption of about 68.5%; and buffer 402A exhibits a reduction in current leakage of about 72.4%.

According to a second other approach, a buffer representing a counterpart to buffer 202A has 6 PFETs and 6 NFETs arranged in two stages of which none of the transistors is an NS_FET (discussed below). An inverter of the second other approach's buffer which represents a counterpart to DE-inverter 214A is not arranged with a capacitive device in a feedback-coupling with respect to the inverter, i.e., does not have a counterpart to capacitive device 218A, but instead is arranged as a 4-stack NE-inverter. In terms of various performance parameters, the buffer according to the second other approach was compared against buffer 202A for the same set of conditions. Among other things, as compared to the buffer according to the second other approach: buffer 402A exhibits reduced variation in slew rate, SR, in a range $(\approx 30.4\%) \leq SR \leq (\approx 36.6\%)$; and buffer 402A exhibits a reduced variation in delay, D, in a range $(\approx 6.8\%) \leq D \leq (\approx 27.5\%)$.

By exploiting the Miller Effect, buffer 402A achieves improved performance as compared to the buffer according to the other approach (as discussed above) without incurring a disadvantage of a larger footprint (area). Rather, as compared to footprint (area) of the buffer according to the other approach, buffer 402A exhibits substantially the same footprint, i.e., the footprint of buffer 402A is not larger than the footprint of the buffer according to the other approach.

In FIG. 4A, in some embodiments, DE-inverter 422 is described in terms of SW_FETs and NS_FETs. In DE-inverter 422: transistors P46 and N44 are SW_FETs whereas transistors P44-P45 and N45-N46 are NS_FETs; and the number of SW_FETs is CSW=2, which is less than the number of NS_FETs, where CNS=4. In DE-inverter 422: the sum of the number of SW_FETs and NS_FETs is $\Sigma$=CSW+ CNS=6; a ratio of the number of the NS_FETs divided by the sum is CNS/Σ=2/3; and a ratio of the number of the SW_FETs divided by the sum is CSW/Σ=1/3.

In FIG. 4A, in some embodiments, buffer 402A is described in terms of SW_FETs and NS_FETs. In buffer 402A: transistors P41-P43, P46 and N41-N44 are SW_FETs whereas transistors P44-P45 and N45-N46 are NS_FETs; and the number of SW_FETs is CSW=8, which is greater than the number of NS_FETS, where CNS=4. In buffer 402A: the sum of the number of SW_FETs and NS_FETs is Σ=12; a ratio of the number of the NS_FETs divided by the sum of the number of SW_FETs and NS_FETs is CNS/Σ=1/3; and a ratio of the number of the SW_FETs divided by the sum is CSW/Σ=2/3.

Figure 4B:
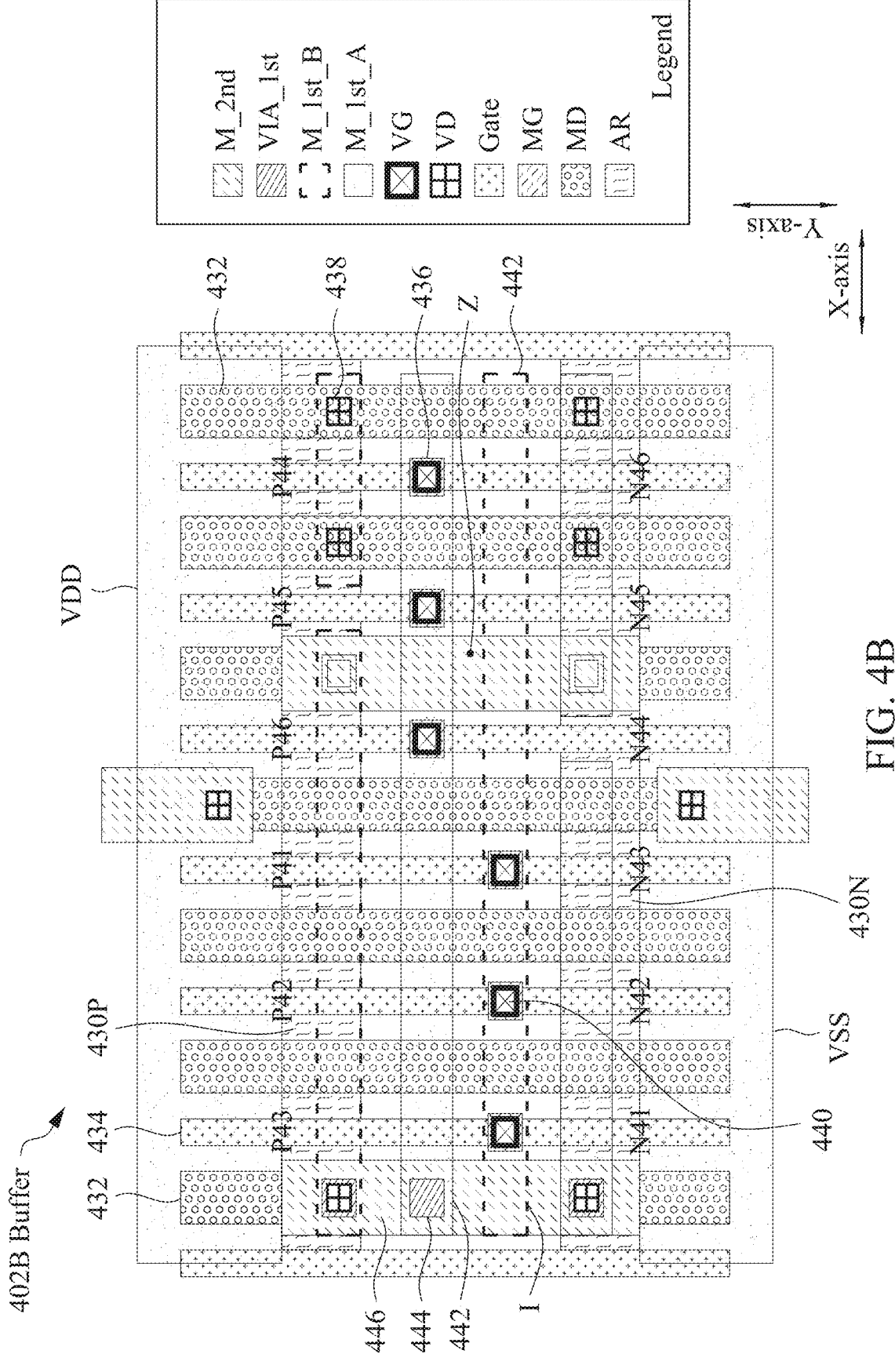
FIGS. 4B-4C are layout diagrams corresponding to the circuit of FIG. 4A, in accordance with some embodiments.

FIG. 4B is a layout diagram of buffer 402B which corresponds to buffer 402A of FIG. 4A, in accordance with some embodiments.

A semiconductor device having a buffer cell-region based on buffer 402B is an example of buffer cell region 102(1) of FIG. 1. General locations of PFETs P31-P36 and NFETs N31-N36 are shown in FIG. 4B.

The layout diagram of FIG. 4B is similar to the layout diagram of FIG. 2B. For purposes of brevity, discussion of aspects of FIG. 4B which are similar to aspects of FIG. 2B will be shortened or omitted.

In FIG. 4B, buffer 402B includes an active region (AR) 430P which is configured for PMOS technology and an AR 430N which is configured for NMOS technology. ARs 430P and 430N include doped first areas that represent source/drain (S/D) regions (not shown) of the ARs. The S/D regions represent first transistor-components. Second areas of ARs 430P and 430N which are between corresponding S/D regions are channel regions (not shown) that represent second transistor-components.

Gate lines 434 are over corresponding ones of the channel regions. Gate lines 434 represent third transistor-components. MD contact structures 432 are over corresponding ones of the S/D regions. MD contact structures 432 represent a first type of third transistor-components. In some embodiments, a given S/D region is formed by doping a portion of an AR that is between corresponding instances of gate lines 434 with an appropriate conductivity-type dopant. MG contact structures 436 are over corresponding ones of gate lines 434. In some embodiments, MG contact structures 436 represent a first type of fifth transistor-components.

VD contact structures 438 represent connections between corresponding MD contact structures 432 and M_1st conductive segments 442. VD contact structures 438 also represent a second type of fifth transistor-components. VG contact structures 440 represent connections between gate lines 434 and M_1st conductive segments 442, and more specifically between MG contact structures 436 and M_1st conductive segments 442. M_1st conductive segments 442 are over corresponding gate lines 434 and MD contact structures 432. VG contact structures 440 also represent a third type of fifth transistor-components. VIA_1st structures 444 represent connections between corresponding M_1st conductive segments 442 and M_2nd conductive segments 446. M_2nd conductive segments 446 are over corresponding M_1st conductive segments 442.

Figure 4C:
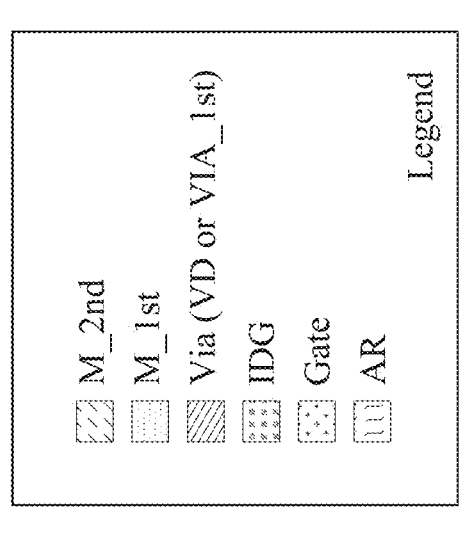
Figure 4C:
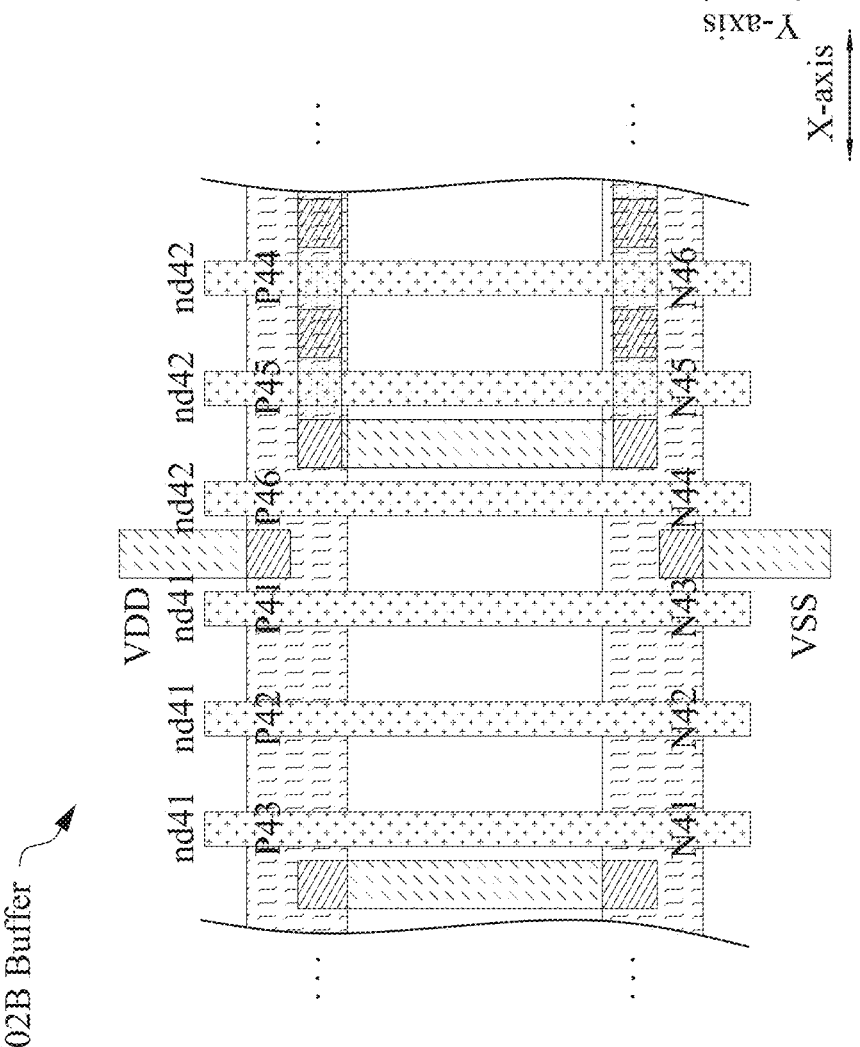

FIG. 4C is a layout diagram of buffer 402B which corresponds to buffer 402A of FIG. 4A, in accordance with some embodiments.

The layout diagram of FIG. 4C is a simplified version showing fewer shapes than the layout diagram of buffer 402B of FIG. 4B. FIG. 4C is provided for purposes of facilitating comparison with the layout diagram of FIG. 4D.

Figure 4D:
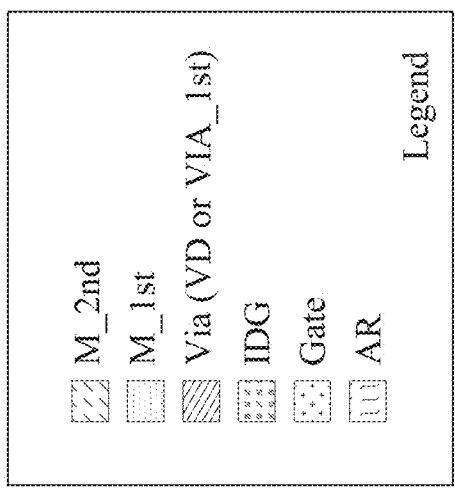
FIG. 4D is a layout diagram, in accordance with some embodiments.
Figure 4D:
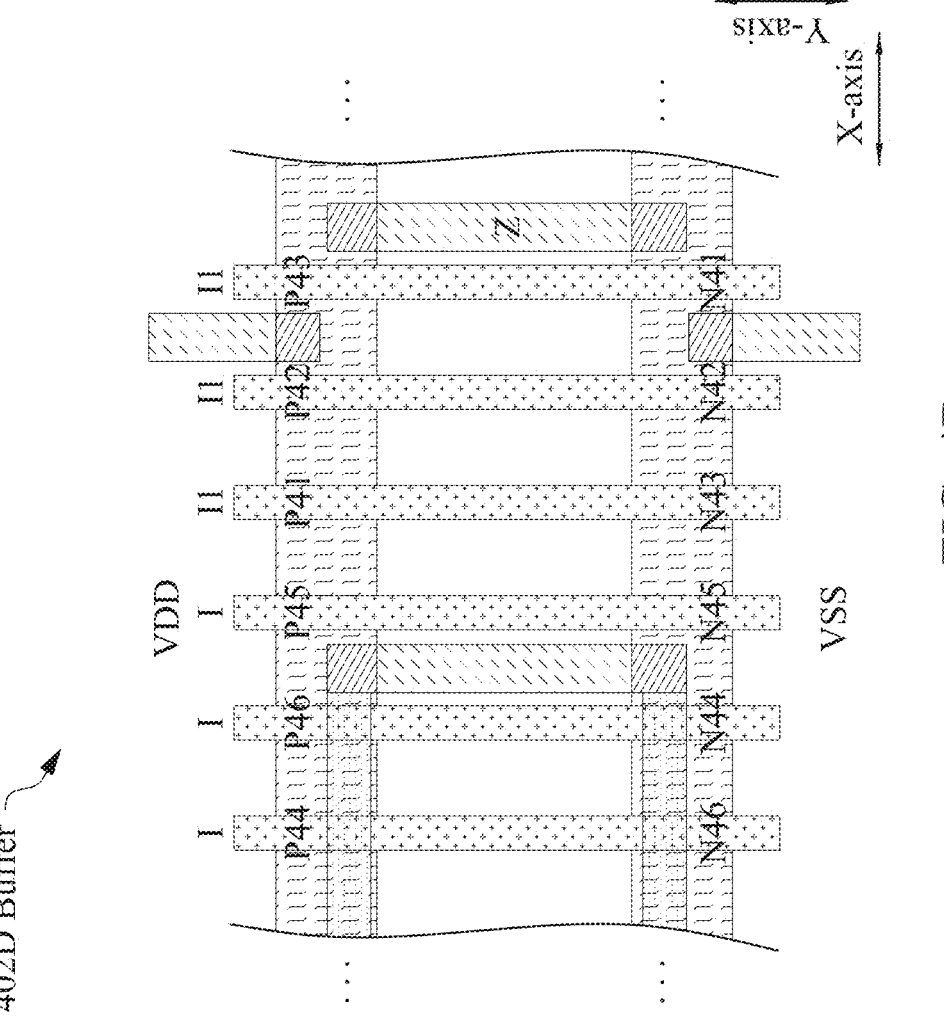

FIG. 4D is a layout diagram of buffer 402D which represents a variation of buffer 402A of FIGS. 4B-4C, in accordance with some embodiments.

The schematic diagram (not shown) represented by buffer 402D is similar to buffer 402A in that each of the variation schematic diagram (not shown) and buffer 402A includes NE-inverter 408 and DE-inverter 422 coupled in series. In some embodiments, buffer 402D is referred to as delay cell 402D. A semiconductor device having a buffer cell-region corresponding to buffer 402D is an example of buffer cell region 102(1) of FIG. 1.

Regarding FIG. 4D, the variation schematic diagram (not shown) represented by buffer 402D differs from buffer 402A in terms of the series arrangement of NE-inverter 408 and DE-inverter 422. In the variation schematic diagram (not shown) represented by buffer 402D, DE-inverter 422 precedes NE-inverter 408 whereas NE-inverter 408 precedes DE-inverter 422 in buffer 402A of FIG. 4A. Accordingly, the layout diagram of buffer 402D of FIG. 4D represents DE-inverter 422 as preceding NE-inverter 408 which is reflected, e.g., in the left-to-right arrangement of transistors P41-P46 and the left-to-right arrangement of transistors N41-N46 in FIG. 4D being different as compared to the corresponding left-to-right arrangement of transistors P41-P46 and left-to-right arrangement of transistors N41-N46 in FIGS. 4B-4C.

Figure 5A:
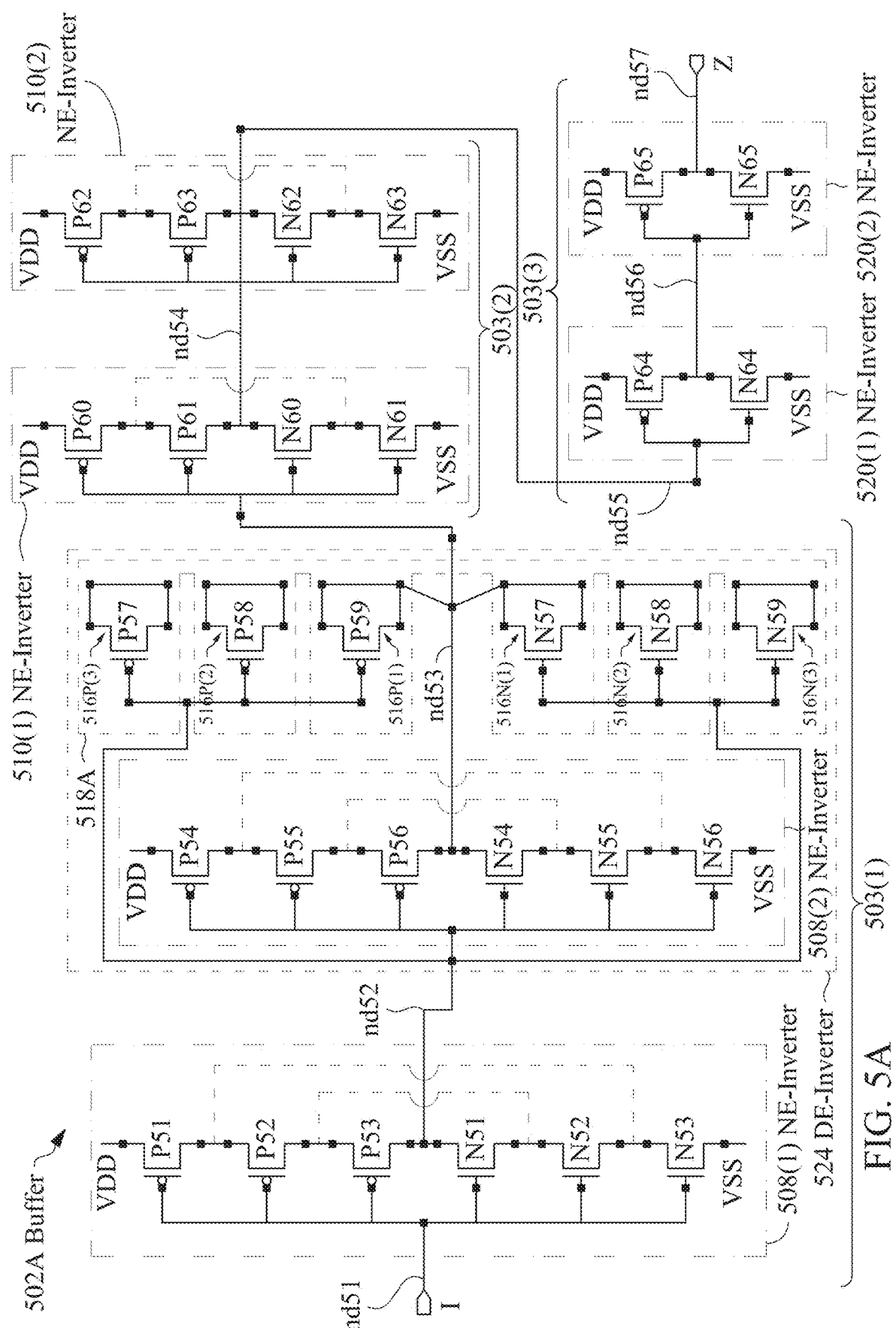
FIGS. 5A-5B are schematic diagrams, in accordance with some embodiments.

FIG. 5A is a schematic diagram of a buffer 502A, in accordance with some embodiments.

Buffer 502A includes an NE-inverter 508(1), a DE-inverter 524, an NE-inverter 510(1), an NE-inverter 510(2), an NE-inverter 520(1) and an NE-inverter 520(2). In some embodiments, buffer 502A is referred to as delay cell 502A. A semiconductor device having a buffer cell-region corresponding to buffer 502A is an example of buffer cell region 102(1) of FIG. 1. Buffer 502A includes 15 PFETs and 15 NFETs for a total of 30 FETs.

In FIG. 5A, an input of buffer 502A is represented by a node nd51 which also represents an input of NE-inverter 508(1).

An output of NE-inverter 508(1) is represented by a node nd52 which also represents an input of DE-inverter 524, i.e., DE-inverter 524 is coupled in series with NE-inverter 508(1).

An output of DE-inverter 524 is represented by a node nd53 which also represents an input of NE-inverter 510(1). An output of NE-inverter 510(1) is represented by a node nd54 which also represents an input of NE-inverter 510(2). An output of NE-inverter 510(2) is represented by a node nd55 which also represents an input of NE-inverter 520(1). An output of NE-inverter 520(1) is represented by a node nd56 which also represents an input of NE-inverter 520(2). An output of NE-inverter 520(2) is represented by a node nd57 which also represents an output of buffer 502A.

NE-inverter 508(1) includes PFETs P51-P53 and NFETs N51-N53 coupled in series between a first reference voltage and a second reference voltage. In some embodiments, the first reference voltage is VDD and the second reference voltage is VSS. Transistors P51-P53 are coupled between VDD and node nd52. Transistors N51-N53 are coupled in series between node nd52 and VSS. NE-inverter 508(1) of FIG. 5A is similar to NE-inverter 408 of FIG. 4A in that each includes six FETs. In some embodiments, NE-inverter 508(1) is described as a six-stack inverter. In some embodiments, buffer 502A is described as having six stages corresponding to NE-inverter 508(1), DE-inverter 524, NE-inverter 510(1), NE-inverter 510(2), NE-inverter 520(1) and NE-inverter 520(2). In some embodiments, each of NE-inverter 508(1), NE-inverter 510(1) and NE-inverter 510(2) is a float-resistant inverter that includes an anti-float shunt.

In FIG. 5A, DE-inverter 524 includes an NE-inverter 508(2) and a capacitive device 518A, where capacitive device 518A is feedback-coupled between nodes nd53 and nd52. NE-inverter 508(2) includes PFETs P54-P56 and NFETs N54-N56 in series between VDD and VSS. Transistors P54-P56 are coupled between VDD and node nd53. Transistors N54-N56 are coupled between node nd53 and VSS. In some embodiments, NE-inverter 508(2) is described as a six-stack inverter. In some embodiments, NE-inverter 508(2) is a float-resistant inverter that includes an anti-float shunt.

Capacitive device 518A includes capacitive components 516P(1)-516P(3) and 516N(1)-516N(3), each of which is feedback-coupled between nodes nd53 and nd52. Capacitive component 516P(1) includes a PFET P59 having a capacitor-configuration. A gate terminal of transistor P59 is coupled to node nd52. Both S/D terminals of transistor P59 are coupled to node nd53. Capacitive component 516P(2) includes a PFET P58 having a capacitor-configuration. A gate terminal of transistor P58 is coupled to node nd52. Both S/D terminals of transistor P58 are coupled to node nd53. Capacitive component 516P(3) includes a PFET P57 having a capacitor-configuration. A gate terminal of transistor P57 is coupled to node nd52. Both S/D terminals of transistor P57 are coupled to node nd53. Capacitive component 516N(1) includes an NFET N57 having a capacitor-configuration. A gate terminal of transistor N57 is coupled to node nd52. Both S/D terminals of transistor N57 are coupled to node nd53. Capacitive component 516N(2) includes an NFET N58 having a capacitor-configuration. A gate terminal of transistor N58 is coupled to node nd52. Both S/D terminals of transistor N58 are coupled to node nd53. Capacitive component 516N(3) includes a NFET N59 having a capacitor-configuration. A gate terminal of transistor N59 is coupled to node nd52. Both S/D terminals of transistor N59 are coupled to node nd53.

Each of capacitor-configured transistors P57-P59 and N57-N59 has the gate-leading orientation similar to FIG. 2G. In some embodiments, capacitor-configured transistors P57-P59 and N57-N59 variously have the PFET and NFET orientations of FIG. 2H, 2I or 2J, or the like. In some embodiments, first and second ones of capacitor-configured transistors P57-P59 have different orientations than a third one of P57-P59. In some embodiments, first and second ones of capacitor-configured transistors N57-N59 have different orientations than a third one of N57-N59.

In total, DE-inverter 524 includes twelve transistors. In light of transistors P57-P59 and N57-N59 being capacitor-configured, in some embodiments, DE-inverter 524 is described as a six-stack inverter.

In FIG. 5A, NE-inverter 520(1) includes PFET P64 and NFET N64 in series between VDD and VSS. Transistor P64 is coupled between VDD and node nd56. Transistor N64 is coupled between node nd56 and VSS. In some embodiments, NE-inverter 520(1) is described as a two-stack inverter.

NE-inverter 520(2) includes PFET P65 and NFET N65 in series between VDD and VSS. Transistor P65 is coupled between VDD and node nd57. Transistor N65 is coupled between node nd57 and VSS. In some embodiments, NE-inverter 520(2) is described as a two-stack inverter.

According to a third other approach a buffer representing a counterpart to buffer 502A has 15 PFETs and 15 NFETs arranged in eight stages of which two of the transistors are NS_FETs albeit not arranged in a feedback-coupling. Inverters of the third other approach's buffer which represent a counterpart to NE-inverter 524 are not arranged with a capacitive device in a feedback-coupling with respect to the inverters, i.e., do not have a counterpart to capacitive device 518A. In terms of various performance parameters, the buffer according to the third other approach was compared against buffer 502A for the same set of conditions. Among other things, as compared to the buffer according to the third other approach, buffer 502A exhibits an increased delay, D, in a range ($\approx$24.1%)$\approx$D$\leq$($\approx$107.9%); a reduction in the on-chip variation (OCV) with respect to mean delay (D), AVG_OCV(D), in a range ($\approx$18.4%)$\leq$AVG_OCV(D)$\leq$ ($\approx$64.8%); a reduction in the on-chip variation (OCV) with respect to mean slew rate (SR), AVG_OCV(SR), in a range ($\approx$0.9%)$\leq$AVG_OCV(SR)$\leq$($\approx$11.7%); a reduction in power consumption, PWR, in a range ($\approx$32.3%)$\leq$PWR$\leq$($\approx$64.9%); and a reduction in leakage current, L, in a range ($\approx$32.3%) $\leq$L$\leq$($\approx$44.0%). In addition, buffer 502A does not increase latency as compared to the third other approach.

By exploiting the Miller Effect, buffer 502A achieves improved performance as compared to the buffer according to the other approach (as discussed above) without incurring a disadvantage of a larger footprint (area). Rather, as compared to footprint (area) of the buffer according to the other approach, buffer 502A exhibits substantially the same footprint, i.e., the footprint of buffer 502A is not larger than the footprint of the buffer according to the other approach.

In FIG. 5A, in some embodiments, DE-inverter 524 is described in terms of SW_FETs and NS_FETs. In DE-inverter 524: transistors P54-P56 and N54-N56 are SW_FETs whereas transistors P57-P59 and N57-N59 are NS_FETs; and the number of SW_FETs is CSW=6, which is the same as the number of NS_FETs, where CNS=6. In DE-inverter 524: the sum of the number of SW_FETs and NS_FETs is $\Sigma$=CSW+CNS=12; a ratio of the number of the NS_FETs divided by the sum is CNS/$\Sigma$=0.5; and a ratio of the number of the SW_FETs divided by the sum is CSW/$\Sigma$=0.5.

In some embodiments, buffer 502A is described as including buffering units 503(1), 503(2) and 503(3). Buffering unit 503(1) includes NE-inverter 508(1) and DE-inverter 524. Buffering unit 503(2) includes NE-inverters 510(1) and 510(2). Buffering unit 503(3) includes NE-inverters 520(1) and 520(2).

In FIG. 5A, in some embodiments, buffering unit 503(1) is described in terms of SW_FETs and NS_FETs. In buffering unit 503(1): transistors P51-P56 and N51-N56 are SW_FETs whereas transistors P57-P59 and N57-N59 are NS_FETs; and the number of SW_FETs is CSW=12, which is greater than the number of NS_FETS, where CNS=6. In buffering unit 503(1): the sum of the number of SW_FETs and NS_FETs is $\Sigma$=18; a ratio of the number of the NS_FETs divided by the sum of the number of SW_FETs and NS_FETs is CNS/$\Sigma$=1/3; and a ratio of the number of the SW_FETs divided by the sum is CSW/$\Sigma$=2/3.

In FIG. 5A, in some embodiments, buffering unit 503(2) is described in terms of SW_FETs and NS_FETs. In buffering unit 503(2): transistors P60-P62 and N60-N62 are SW_FETs whereas no transistors are NS_FETs; and the number of SW_FETs is CSW=8, which is greater than the number of NS_FETS, where CNS=0. In buffering unit 503(2): the sum of the number of SW_FETs and NS_FETs is $\Sigma$=8; a ratio of the number of the NS_FETs divided by the sum of the number of SW_FETs and NS_FETs is CNS/ $\Sigma$=0.0; and a ratio of the number of the SW_FETs divided by the sum is CSW/$\Sigma$=1.

In FIG. 5A, in some embodiments, buffering unit 503(3) is described in terms of SW_FETs and NS_FETs. In buffering unit 503(3): transistors P64-P65 and N64-N65 are SW_FETs whereas no transistors are NS_FETs; and the number of SW_FETs is CSW=4, which is greater than the number of NS_FETS, where CNS=0. In buffering unit 503(3): the sum of the number of SW_FETs and NS_FETs is Σ=4; a ratio of the number of the NS_FETs divided by the sum of the number of SW_FETs and NS_FETs is CNS/Σ=0.0; and a ratio of the number of the SW_FETs divided by the sum is CSW/Σ=1.

In FIG. 5A, in some embodiments, buffer 502A is described in terms of SW_FETs and NS_FETs. In buffer 502A: transistors P51-P56, P60-P65, N51-N56 and N60-N63 are SW_FETs whereas transistors P57-P59 and N57-N59 are NS_FETs; and the number of SW_FETs is CSW=24, which is greater than the number of NS_FETS, where CNS=6. In buffer 502A: the sum of the number of SW_FETs and NS_FETs is Σ=30; a ratio of the number of the NS_FETs divided by the sum of the number of SW_FETs and NS_FETs is CNS/Σ=0.2; and a ratio of the number of the SW_FETs divided by the sum is CSW/Σ=0.8.

Figure 5B:
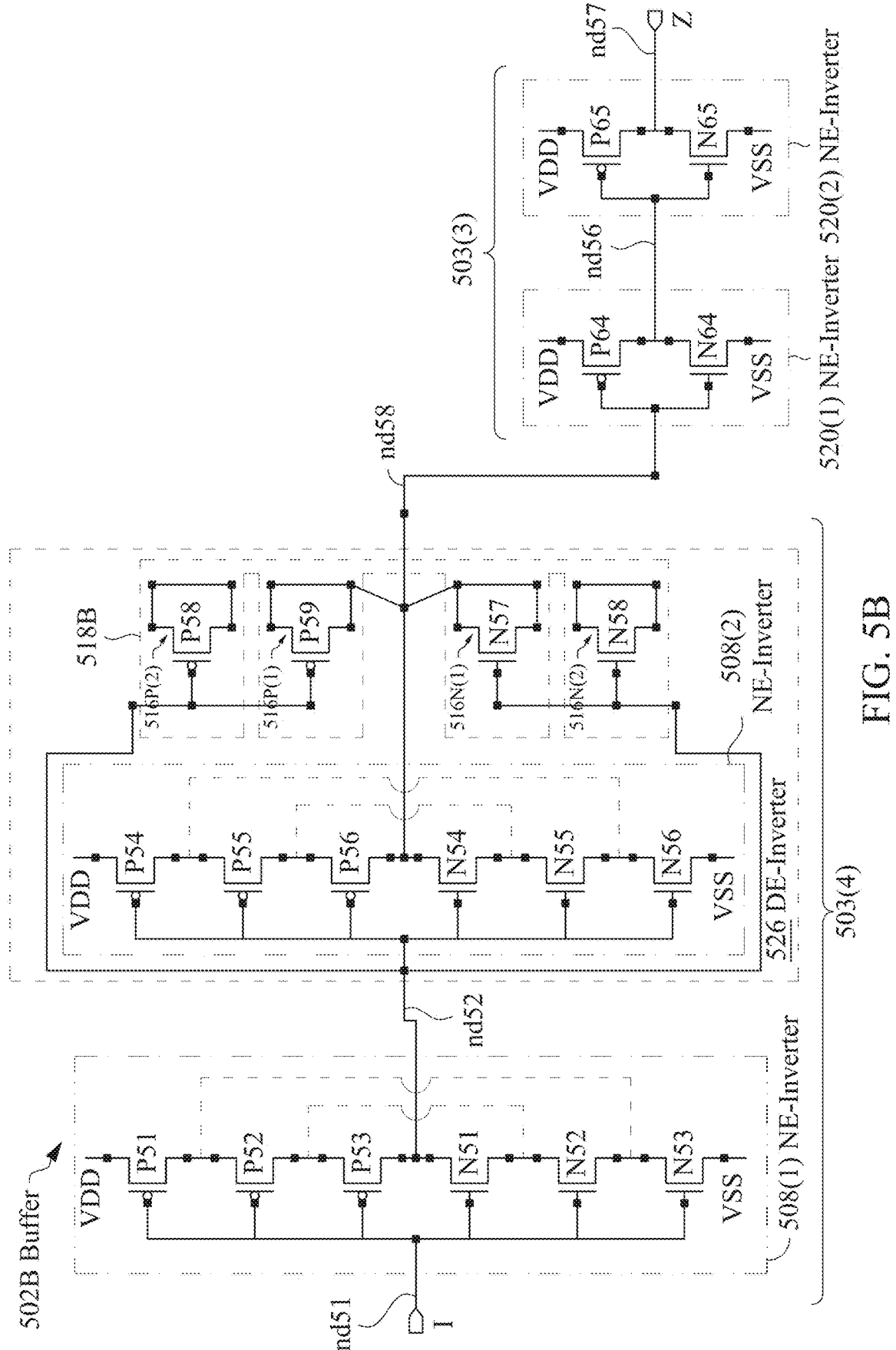

FIG. 5B is a schematic diagram of a buffer 502B, in accordance with some embodiments.

Buffer 502B is similar to buffer 502A. For the sake of brevity, the discussion will focus primarily on the differences between buffer 502B and buffer 502A. Each of buffer 502B and buffer 502A includes an NE-inverter 508(1), NE-inverter 520(1) and NE-inverter 520(2). Nevertheless, buffer 502B differs from buffer 502A as follows: buffer 502B does not include NE-inverters 510(1)-510(2); and buffer 502B includes a DE-inverter 526 rather than, i.e., in place of, DE-inverter 524. In some embodiments, buffer 502B is referred to as delay cell 502B. A semiconductor device having a buffer cell-region corresponding to buffer 502B is an example of buffer cell region 102(1) of FIG. 1. Buffer 502B includes 10 PFETs and 10 NFETs for a total of 20 FETs.

In FIG. 5B, the output of NE-inverter 508(1) is represented by node nd52 which also represents an input of DE-inverter 526, i.e., DE-inverter 526 is coupled in series with NE-inverter 508(1). An output of DE-inverter 526 is represented by a node nd58 which also represents the input of NE-inverter 520(1).

DE-inverter 526 of FIG. 5B is similar to DE-inverter 524 of FIG. 5A. Nevertheless, DE-inverter 526 differs from DE-inverter 524 in that DE-inverter 526 includes a capacitive device 518B whereas DE-inverter 524 includes capacitive device 518A. Capacitive device 518B is feedback-coupled between nodes nd58 and nd52.

Capacitive device 518B of FIG. 5B is similar to capacitive device 518A of FIG. 5A. Nevertheless, capacitive device 518B differs from capacitive device 518A in that capacitive device 518B does not include capacitive components 516P(3) and 516N(3), and thus does not include corresponding transistors P57 and N59.

In total, DE-inverter 526 includes ten transistors. In light of transistors P58-P59 and N57-N58 being capacitor-configured, in some embodiments, DE-inverter 526 is described as a six-stack inverter.

According to a fourth other approach a buffer representing a counterpart to buffer 502B has 10 PFETs and 10 NFETs arranged in six stages of which no transistors are NS_FETs. Inverters of the fourth other approach's buffer which represent a counterpart to NE-inverter 526 are not arranged with a capacitive device in a feedback-coupling with respect to the inverters, i.e., do not have a counterpart to capacitive device 518B. In terms of various performance parameters, the buffer according to the fourth other approach was compared against buffer 502B for the same set of conditions. Among other things, as compared to the buffer according to the fourth other approach, buffer 502B exhibits an increased delay, D, in a range ($\approx$12.6%)$\leq$D$\leq$($\approx$88.7%); a reduction in the on-chip variation (OCV) with respect to mean delay (D), AVG_OCV(D), in a range ($\approx$8.7%)$\leq$AVG_OCV(D)$\leq$ ($\approx$62.4%); a reduction in the on-chip variation (OCV) with respect to mean slew rate (SR), AVG_OCV(SR), in a range ($\approx$1.5%)$\leq$AVG_OCV(SR)$\leq$($\approx$0.6%); a reduction in power consumption, PWR, in a range ($\approx$45.8%)$\leq$PWR$\leq$($\approx$68.8%); and a reduction in leakage current, L, in a range ($\approx$58.34%)$\leq$L$\leq$($\approx$51.6%). In addition, buffer 502B does not increase latency as compared to the fourth other approach.

By exploiting the Miller Effect, buffer 502B achieves improved performance as compared to the buffer according to the other approach (as discussed above) without incurring a disadvantage of a larger footprint (area). Rather, as compared to footprint (area) of the buffer according to the other approach, buffer 502B exhibits substantially the same footprint, i.e., the footprint of buffer 502B is not larger than the footprint of the buffer according to the other approach.

In FIG. 5B, in some embodiments, DE-inverter 526 is described in terms of SW_FETs and NS_FETs. In DE-inverter 526: transistors P54-P56 and N54-N56 are SW_FETs whereas transistors P58-P59 and N57-N58 are NS_FETs; and the number of SW_FETs is CSW=6, which is the greater than the number of NS_FETs, where CNS=4. In DE-inverter 526: the sum of the number of SW_FETs and NS_FETs is Σ=CSW+CNS=10; a ratio of the number of the NS_FETs divided by the sum is CNS/Σ=0.4; and a ratio of the number of the SW_FETs divided by the sum is CSW/Σ=0.6.

In some embodiments, buffer 502B is described as including buffering units 503(4) and 503(3). Buffering unit 503(4) includes NE-inverter 508(1) and DE-inverter 526.

In FIG. 5B, in some embodiments, buffering unit 503(4) is described in terms of SW_FETs and NS_FETs. In buffering unit 503(4): transistors P51-P56 and N51-N56 are SW_FETs whereas transistors P58-P59 and N57-N58 are NS_FETs; and the number of SW_FETs is CSW=12, which is greater than the number of NS_FETS, where CNS=4. In buffering unit 503(4): the sum of the number of SW_FETs and NS_FETs is Σ=16; a ratio of the number of the NS_FETs divided by the sum of the number of SW_FETs and NS_FETs is CNS/Σ=0.25; and a ratio of the number of the SW_FETs divided by the sum is CSW/Σ=0.75.

In FIG. 5B, in some embodiments, buffer 502B is described in terms of SW_FETs and NS_FETs. In buffer 502B: transistors P51-P56, P64-P65, N51-N56 and N64-N65 are SW_FETs whereas transistors P58-P59 and N57-N58 are NS_FETs; and the number of SW_FETs is CSW=16, which is greater than the number of NS_FETS, where CNS=4. In buffer 502B: the sum of the number of SW_FETs and NS_FETs is Σ=20; a ratio of the number of the NS_FETs divided by the sum of the number of SW_FETs and NS_FETs is CNS/Σ=0.2; and a ratio of the number of the SW_FETs divided by the sum is CSW/Σ=0.8.

Figure 6A:
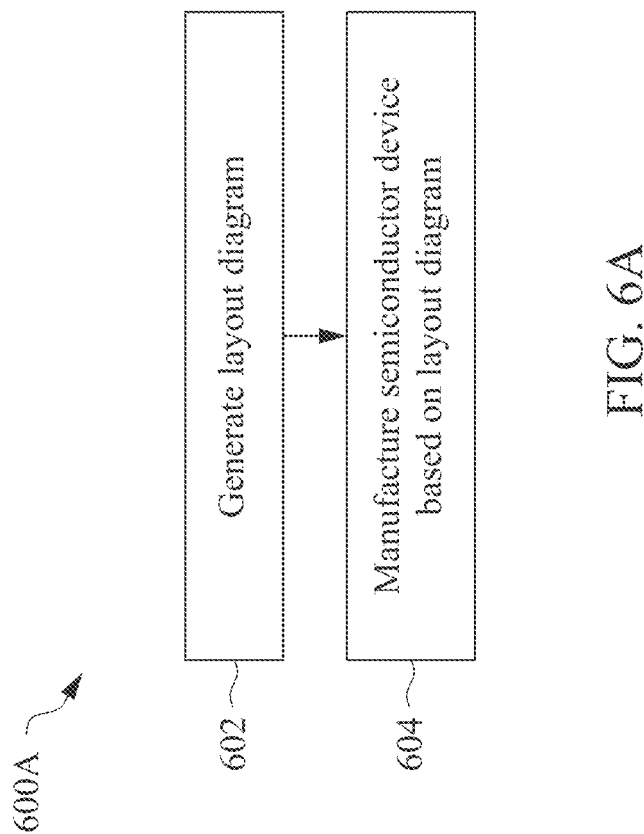

FIG. 6A is a flow diagram 600A of a method of manufacturing a semiconductor device, in accordance with some embodiments.

The method of flowchart 600A is implementable, for example, using EDA system 700 (FIG. 7, discussed below) and an IC manufacturing system 800 (FIG. 8, discussed below), in accordance with some embodiments. Examples of a semiconductor device which can be manufactured according to the method of flowchart 600A include the semiconductor device of FIG. 1, semiconductor devices based on the layout diagrams of FIGS. 2B-2C, 2E, 3B-3D, 4B-4D, or the like.

In FIG. 6A, the method of flowchart 600A includes blocks 602-604. At block 602, a layout diagram is generated which, among other things, includes one or more of layout diagrams disclosed herein, or the like. Block 602 is implementable, for example, using EDA system 700 (FIG. 7, discussed below), in accordance with some embodiments. From block 602, flow proceeds to block 604.

At block 604, based on the layout diagram, at least one of (A) one or more photolithographic exposures are made or (B) one or more semiconductor masks are fabricated or (C) one or more components in a layer of a semiconductor device are fabricated. See discussion below of IC manufacturing system 800 in FIG. 8 below.

FIG. 6B is a method 600B of forming a semiconductor device, in accordance with some embodiments.

The method of flowchart 600B is implementable, for example, using IC manufacturing system 800 (FIG. 8, discussed below), in accordance with some embodiments. Examples of a semiconductor device which can be manufactured according to the method of flowchart 600B include the semiconductor device of FIG. 1, semiconductor devices based on the layout diagrams of FIGS. 2B-2C, 2E, 3B-3D, 4B-4D, or the like.

Method 600B includes blocks 610-618. At block 610, a substrate is formed. From block 610, flow proceeds to block 612.

At block 612, active regions (ARs) are formed in the substrate including doping corresponding areas of the substrate. Example of the active regions including ARs 230P and 230N of FIG. 2B, or the like. From block 612, flow proceeds to block 614.

At block 614, source/drain (S/D) regions representing 1st transistor components (TCs) are formed in the ARs including doping corresponding 1st areas of the active regions, wherein second areas of the ARs which are between corresponding S/D regions are channel regions representing 2nd TCs. Examples of channel regions include areas of corresponding ARs which are between gate lines in the areas of corresponding ARs 230P and 230N which are between gate lines 234 of FIG. 2B, or the like. From block 614, flow proceeds to block 616.

At block 616, gate lines representing 4th TCs are formed over corresponding ones of the channel regions. Examples of the gate lines include gate lines 234 of FIG. 2B, or the like. From block 616, flow proceeds to block 618.

At block 618, metal-to-S/D (MD) contact structures representing 3rd TCs are formed over corresponding S/D regions. Examples of MD contact structures include MD contact structures 232 of FIG. 2B, or the like. From block 618, flow proceeds to block 620.

At block 620, in a transistor layer, first interconnection structures representing 5th TCs are formed over corresponding ones of the gate lines and the MD contact structures. An example of the transistor layer is transistor layer 231 of FIGS. 2K-2M, or the like. Examples of the 5th TCs include MG contact structures 236 over corresponding gate lines 234 and VG contact structures 240 over corresponding MG contact structures 236 in FIG. 2B, VD contact structures 238 over corresponding MD contact structures 232 in FIG. 2B, or the like.

Regarding block 620, in some embodiments, the first interconnection structures connect: a first set of the first to fourth transistor-components as corresponding switching-configured transistors; and a second set of the first to fourth transistor-components as corresponding non-switching-configured transistors. Examples of the switching-configured transistors include transistors P25-P26 and N24-N25 of FIGS. 2A-2B, or the like. Examples of the non-switching-configured transistors include transistors P24 and N26, or the like. From block 620, flow proceeds to block 622.

At block 622, above the transistor layer, first metallization segments are formed over corresponding ones of the first interconnection structures. Examples of the metallization segments include M_1st segments 242 in FIGS. 2B and 2K-2M, or the like. In some embodiments, at block 622, second interconnection structures and second metallization segments are also formed. Examples of the second interconnection structures include VIA_1st contact structures 244 in FIGS. 2B and 2K-2M, or the like. Examples of the second metallization segments include M_2nd segments 246 in FIGS. 2B and 2K-2M, or the like.

Regarding block 622, in some embodiments, the metallization segments connect: the switching-configured transistors as an NE-inverter (e.g., NE—210 FIGS. 2A & 2D, 320 FIG. 3A, 420 FIG. 4A, 508(2) FIGS. 5A-5B, or the like) having an output at a first node and an input at a second node; and the non-switching-configured transistors (e.g., P24 and N26 FIGS. 2A-2B, or the like) as a capacitive device (e.g., 218 FIG. 2A, 418 FIG. 4A, 518A FIG. 5A, 518B FIG. 5B or the like) feedback-coupled between the first node and the second node, as discussed below. Together, the NE-inverter and the capacitive device represent a delay-enhanced inverter. An example of the first reference voltage is VDD. An example of the second reference voltage is VSS. Examples of the first node include nodes nd23 FIG. 2A, nd25 FIG. 2D, nd33 FIG. 3A, nd43 FIG. 4A, nd53 FIG. 5A, nd58 FIG. 5B, or the like. Examples of the second node include nodes nd22 FIG. 2A, nd24 FIG. 2D, nd32 FIG. 3A, nd42 FIG. 4A, nd52 FIGS. 5A-5B, or the like.

Regarding block 620, the capacitive device includes: a first non-switching-configured (NS) PFET (NS_PFET) feedback-coupled between the first node and the second node, the first NS_PFET having a capacitor-configuration; and a first NS NFET (NS_NFET) feedback-coupled between the first node and the second node, the first NS_NFET having a capacitor-configuration. Examples of the capacitive device include capacitive devices 218 FIGS. 2A & 2D, 318 FIG. 3A, 418 FIG. 4A, 518A FIG. 5A, 518B 5B, or the like. Examples of the first PFET having a capacitor-configuration include PFETs P24 FIGS. 2A & 2D, P33 FIG. 3A, P45 FIG. 4A, P59 FIGS. 5A-5B, or the like. Examples of the first NFET having a capacitor-configuration include NFETs N26 FIGS. 2A & 2D, N34 FIG. 3A, N45 FIG. 4A, N57 FIGS. 5A-5B, or the like.

Where FIG. 6B results in a delay-enhanced inverter circuit, in some embodiments, the switching-configured transistors of the NE-inverter include: a first switching-configured PFET (SW_PFET) feedback-coupled between the first reference voltage and the first node; and a first switching-configured NFET (SW_NFET) feedback-coupled between the first node and the second reference voltage; and a gate terminal of each of the first SW_PFET and the first SW_NFET being coupled to the second node. Examples of the first SW_PFET include PFETs P26 FIGS. 2A & 2D, P34 FIG. 3A, P46 FIG. 4A, P56 FIGS. 5A-5B, or the like. Examples of the first SW_NFET include NFETs N24 FIGS. 2A & 2D, N33 FIG. 3A, N44 FIG. 4A, N54 FIGS. 5A-5B, or the like.

Where FIG. 6B results in a delay-enhanced inverter circuit, in some embodiments, the switching-configured transistors of the NE-inverter include: a second SW_PFET coupled in series with the first SW_PFET between the first reference voltage and the first node; a second SW_NFET coupled in series with the first SW_NFET between the first node and the second reference voltage; and a gate terminal of each of the second SW_PFET and the second SW_NFET being coupled to the second node. Examples of the second SW_PFET include PFETs P25 FIGS. 2A & 2D, P55 FIGS. 5A-5B, or the like. Examples of the second SW_NFET include NFETs N25 FIGS. 2A & 2D, N55 FIGS. 5A-5B, or the like.

Where FIG. 6B results in a delay-enhanced inverter circuit, in some embodiments, the switching-configured transistors that define the NE-inverter include: a third SW_PFET coupled in series with the first and second SW_PFETs between the first reference voltage and the first node; a third SW_NFET coupled in series with the first and second SW_NFETs between the first node and the second reference voltage; and a gate terminal of each of the third SW_PFET and the third SW_NFET being coupled to the second node. An example of the third SW_PFET is PFET P54 FIGS. 5A-5B, or the like. An example of the third SW_NFET is NFET N56 FIGS. 5A-5B, or the like.

Where FIG. 6B results in a delay-enhanced inverter circuit, in some embodiments, the non-switching-configured transistors of the capacitive device include: a second NS_PFET coupled in series with the first NS_PFET between the first node and the second node, the second NS_PFET having a capacitor-configuration; and a second NS_NFET coupled in series with the first NS_NFET between the first node and the second node, the second NFET having a capacitor-configuration. Examples of the second NS_PFET include PFETs P44 FIG. 4A, P52 FIGS. 5A-5B, or the like. Examples of the second NS_NFET include NFETs N46 FIG. 4A, N52 FIGS. 5A-5B, or the like.

Where FIG. 6B results in a delay-enhanced inverter circuit, in some embodiments, the non-switching-configured transistors that define the capacitive device further include: a third NS_PFET coupled in series with the first and second NS_PFETs between the first node and the second node, the third NS_PFET having a capacitor-configuration; and a third NS_NFET coupled in series with the first and second NS_NFETs between the first node and the second node, the third NS_NFET having a capacitor-configuration. An example of the third NS_PFET is PFET P59 FIG. 5A, or the like. An example of the third NS_NFET is NFET N53 FIG. 5A, or the like.

Where FIG. 6B results in a delay-enhanced inverter circuit, in some embodiments, the non-switching-configured transistors that define the capacitive device conform to a configuration (A) or a configuration (B). For the configuration (A): an orientation of the capacitor-configuration of the first NS_PFET is a gate-leading orientation in which a gate terminal of the first NS_PFET is coupled to the second node whereas first and second source/drain (S/D) terminals of the first NS_PFET are coupled to the first node; and an orientation of the capacitor-configuration of the first NS_NFET is the gate-leading orientation in which a gate terminal of the first NS_NFET is coupled to the second node whereas first and second S/D terminals of the first NS_NFET are coupled to the first node. An example of such a capacitive device is capacitive device 218A of FIG. 2G in which an example of the first NS_PFET having the gate-leading orientation is PFET P24 FIG. 2G, or the like, and an example of the first NS_NFET having the gate-leading orientation is NFET N26 FIG. 2G, or the like. For the configuration (B): the orientation of the capacitor-configuration of the first NS_PFET is a gate-following orientation in which the gate terminal of the first NS_PFET is coupled to the first node whereas the first and second S/D terminals of the first NS_PFET are coupled to the second node; and the orientation of the capacitor-configuration of the first NS_NFET is the gate-following orientation in which the gate terminal of the first NS_NFET is coupled to the first node whereas the first and second S/D terminals of the first NS_NFET are coupled to the second node. An example of such a capacitive device is capacitive device 218H of FIG. 2H in which an example of the first NS_PFET having the gate-following orientation is PFET P24 FIG. 2H, or the like, and an example of the first NS_NFET having the gate-following orientation is NFET N26 FIG. 2H, or the like.

Where FIG. 6B results in a delay-enhanced inverter circuit, in some embodiments, the non-switching-configured transistors that define a capacitive device conform to a configuration (C) or a configuration (D). For the configuration (C): an orientation of the capacitor-configuration of the first NS_PFET is a gate-leading orientation in which a gate terminal of the first NS_PFET is coupled to the second node whereas first and second source/drain (S/D) terminals of the first NS_PFET are coupled to the first node; and an orientation of the capacitor-configuration of the first NS_NFET is a gate-following orientation in which a gate terminal of the first NS_NFET is coupled to the first node whereas first and second S/D terminals of the first NS_NFET are coupled to the second node. An example of such a capacitive device is capacitive device 218I of FIG. 2I in which an example of the first NS_PFET having the gate-leading orientation is P24 FIG. 2I, or the like, and an example of the first NS_NFET having the gate-leading orientation is N26 FIG. 2I, or the like. For the configuration (D): the orientation of the capacitor-configuration of the first NS_PFET is the gate-following orientation in which the gate terminal of the first NS_PFET is coupled to the first node whereas the first and second S/D terminals of the first NS_PFET are coupled to the second node; and the orientation of the capacitor-configuration of the first NS_NFET is the gate-leading orientation in which the gate terminal of the first NS_NFET is coupled to the second node whereas the first and second S/D terminals of the first NS_NFET are coupled to the first node. An example of such a capacitive device is capacitive device 218J of FIG. 2J in which an example of the first NS_PFET having the gate-following orientation is NS_PFET P24 FIG. 2J, or the like, and an example of the first NS_NFET having the gate-leading orientation is first NS_NFET N26 FIG. 2J, or the like.

Figure 7:
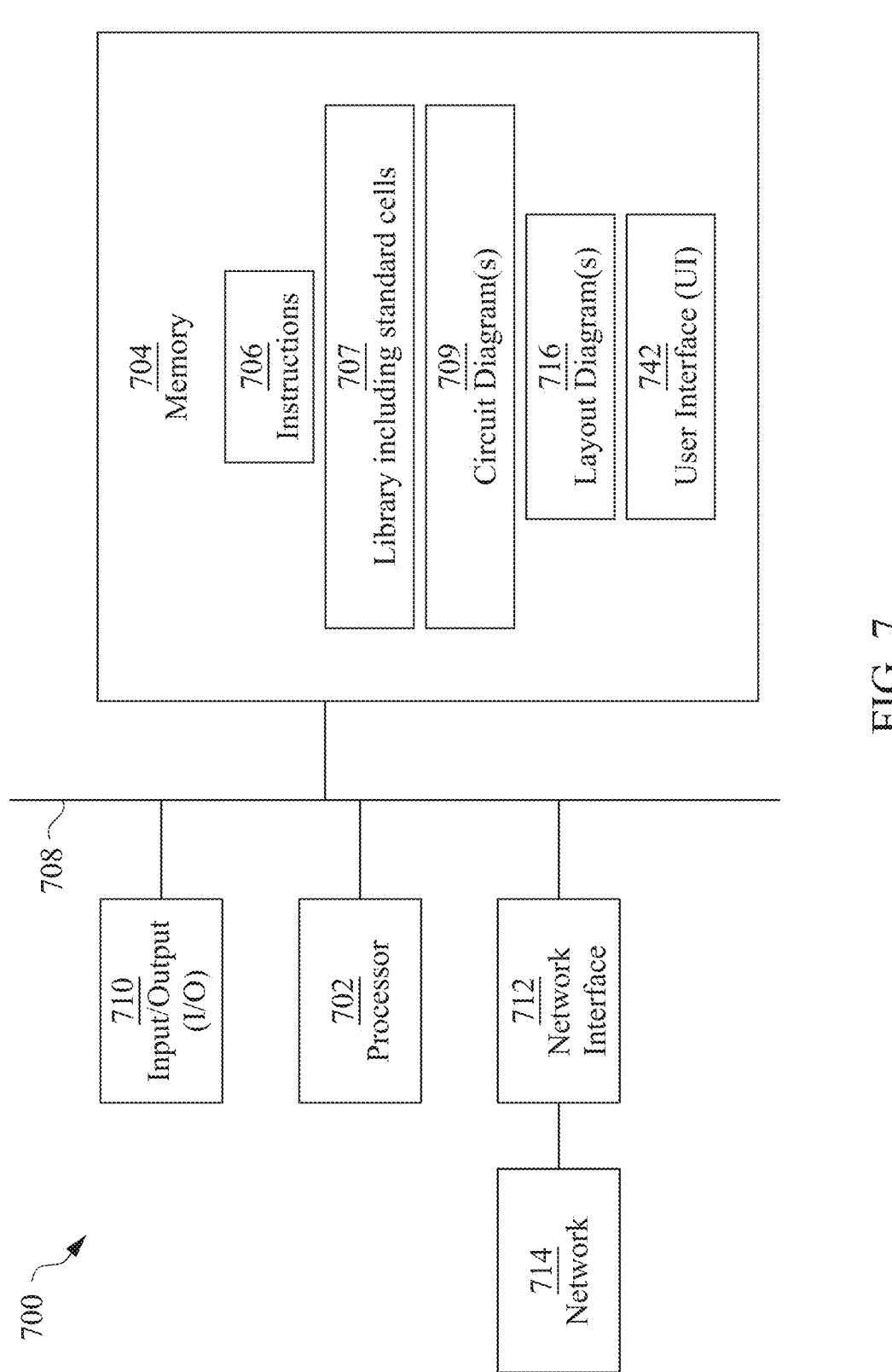
FIG. 7 is a block diagram of an electronic design automation (EDA) system, in accordance with some embodiments.

FIG. 7 is a block diagram of an electronic design automation (EDA) system 700 in accordance with some embodiments.

In some embodiments, EDA system 700 includes an APR system. The method of flowchart 600A of FIG. 6A is implemented, for example, using EDA system 700, in accordance with some embodiments.

In some embodiments, EDA system 700 is a general purpose computing device including a hardware processor 702 and a non-transitory, computer-readable storage medium 704. Storage medium 704, amongst other things, is encoded with, i.e., stores, computer program code 706, i.e., a set of executable instructions. Execution of instructions 706 by hardware processor 702 represents (at least in part) an EDA tool which implements a portion or all of, e.g., the method of FIG. 6A, or the like, in accordance with one or more embodiments (hereinafter, the noted processes and/or methods). Storage medium 704, amongst other things, stores files including: layout diagram(s) 716 that include layout diagrams of FIGS. 2B-2C, 2E, 3B-3D, 4B-4D, or the like; and circuit diagram(s) 709 that include circuit diagrams of FIGS. 2A, 2D, 2F-2J, 3A, 4A, 5A-5B, or the like.

Processor 702 is electrically coupled to computer-readable storage medium 704 via a bus 708. Processor 702 is further electrically coupled to an I/O interface 710 by bus 708. A network interface 712 is further electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code 706 configured to cause system 700 (where such execution represents (at least in part) the EDA tool) to be usable for performing a portion or all of the noted processes and/or methods. In one or more embodiments, storage medium 704 further stores information which facilitates performing a portion or all of the noted processes and/or methods. In one or more embodiments, storage medium 704 stores library 707 of standard cells including such standard cells as disclosed herein.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 further includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
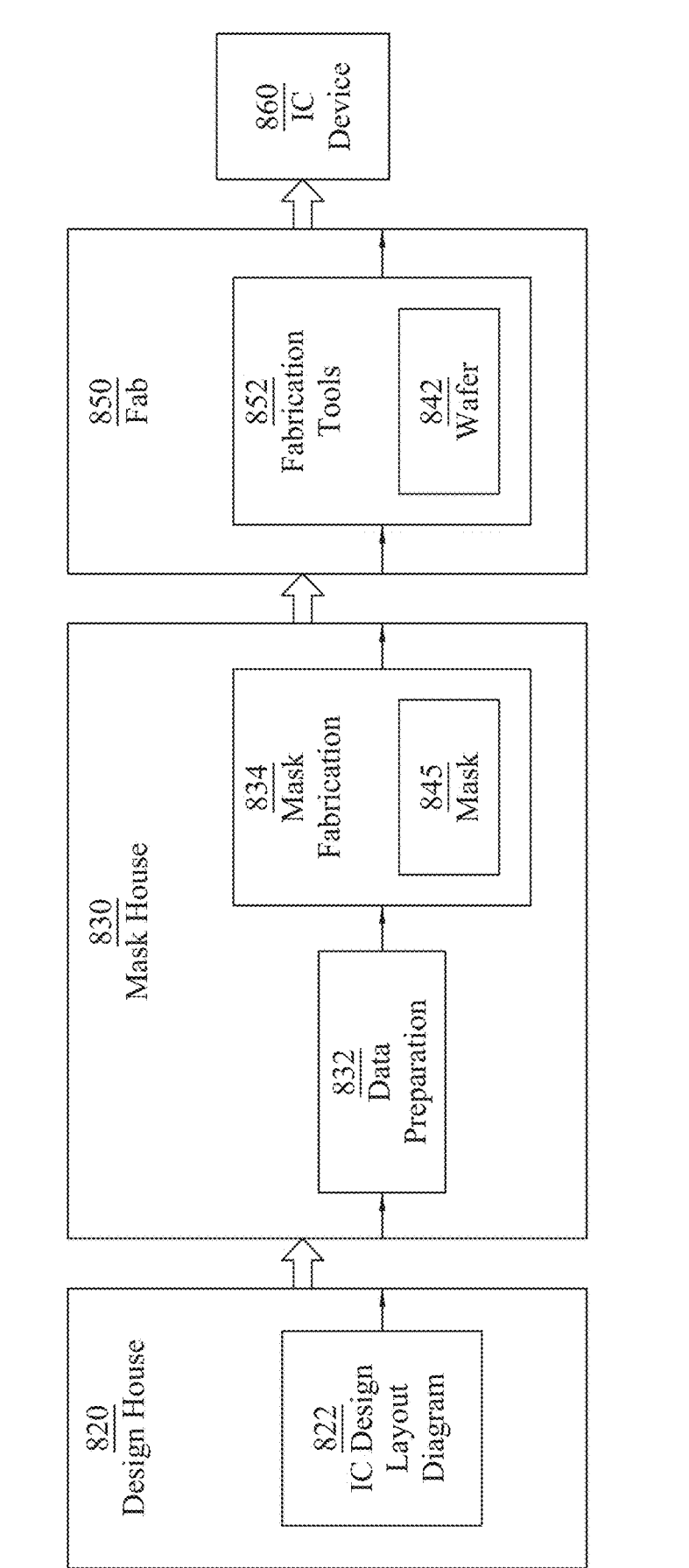
FIG. 8 is a block diagram of an integrated circuit (IC) manufacturing system, and an IC manufacturing flow associated therewith, in accordance with some embodiments.

FIG. 8 is a block diagram of an integrated circuit (IC) manufacturing system 800, and an IC manufacturing flow associated therewith, in accordance with some embodiments.

After block 604 of FIG. 6A, based on the layout, at least one of (A) one or more semiconductor masks or (B) at least one component in a layer of an inchoate semiconductor integrated circuit is fabricated using manufacturing system 800.

In FIG. 8, IC manufacturing system 800 includes entities, such as a design house 820, a mask house 830, and an IC manufacturer/fabricator ("fab") 840, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 820, mask house 830, and IC fab 840 is owned by a single larger company. In some embodiments, two or more of design house 820, mask house 830, and IC fab 840 coexist in a common facility and use common resources.

Design house (or design team) 820 generates an IC design layout 822. IC design layout 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout 822. The design procedure includes one or more of logic design, physical design or place and route. IC design layout 822 is presented in one or more data files having information of the geometrical patterns. For example, IC design layout 822 is expressed in a GDSII file format or DFII file format.

Mask house 830 includes data preparation 832 and mask fabrication 834. Mask house 830 uses IC design layout 822 to manufacture one or more masks to be used for fabricating the various layers of IC device 860 according to IC design layout 822. Mask house 830 performs mask data preparation 832, where IC design layout 822 is translated into a representative data file ("RDF"). Mask data preparation 832 supplies the RDF to mask fabrication 834. Mask fabrication 834 includes a mask writer. A mask writer converts the RDF to an image on a substrate, such as a mask (reticle) or a semiconductor wafer. The design layout is manipulated by mask data preparation 832 to comply with particular characteristics of the mask writer and/or requirements of IC fab 840. In FIG. 8, mask data preparation 832, mask fabrication 834, and mask 845 are illustrated as separate elements. In some embodiments, mask data preparation 832 and mask fabrication 834 are collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is further used, which treats OPC as an inverse imaging problem.

In some embodiments, mask data preparation 832 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 834, which may undo part of the modifications performed by OPC in order to meet mask creation rules.

In some embodiments, mask data preparation 832 includes lithography process checking (LPC) that simulates processing that will be implemented by IC fab 840 to fabricate IC device 860. LPC simulates this processing based on IC design layout 822 to fabricate a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been fabricated by LPC, if the simulated device is not close enough in shape to satisfy design rules, OPC and/or MRC are be repeated to further refine IC design layout 822.

The above description of mask data preparation 832 has been simplified for the purposes of clarity. In some embodiments, data preparation 832 includes additional features such as a logic operation (LOP) to modify the IC design layout according to manufacturing rules. Additionally, the processes applied to IC design layout 822 during data preparation 832 may be executed in a variety of different orders.

After mask data preparation 832 and during mask fabrication 834, a mask 845 or a group of masks are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 834 is used in a variety of processes. For example, such a mask(s) is used in an ion implantation process to form various doped regions in the semiconductor wafer, in an etching process to form various etching regions in the semiconductor wafer, and/or in other suitable processes.

IC fab 840 is an IC fabrication business that includes one or more manufacturing facilities for the fabrication of a variety of different IC products. In some embodiments, IC fab 840 is a semiconductor foundry. For example, there may be a manufacturing facility for the front end fabrication of a plurality of IC products (front-end-of-line (FEOL) fabrication), while a second manufacturing facility may supply the back end fabrication for the interconnection and packaging of the IC products (back-end-of-line (BEOL) fabrication), and a third manufacturing facility may supply other services for the foundry business.

IC fab 840 uses the mask (or masks) fabricated by mask house 830 to fabricate IC device 860 using fabrication tools 852. Thus, IC fab 840 at least indirectly uses IC design layout 822 to fabricate IC device 860. In some embodiments, a semiconductor wafer 842 is fabricated by IC fab 840 using the mask (or masks) to form IC device 860. Semiconductor wafer 842 includes a silicon substrate or other proper substrate having material layers formed thereon. Semiconductor wafer further includes one or more of various doped regions, dielectric features, multilevel interconnects, and the like (formed at subsequent manufacturing steps).

In some embodiments, a delay-enhanced inverter circuit (DE-inverter) includes a non-delay-enhanced inverter circuit (NE-inverter) having an output at a first node and an input at a second node, and a capacitive device feedback-coupled between the first node and the second node, the capacitive device including: a first positive-channel metal-oxide (PMOS) field-effect transistor (FET) (PFET) feedback-coupled between the first node and the second node, the first PFET having a capacitor-configuration; and a first negative-channel metal-oxide (NMOS) FET (NFET) feedback-coupled between the first node and the first reference voltage, the first NFET having a capacitor-configuration.

In some embodiments, the NE-inverter includes: a second positive-channel metal-oxide (PMOS) field-effect transistor (FET) (PFET) feedback-coupled between a first reference voltage and the first node; and a second negative-channel metal-oxide (NMOS) FET (NFET) feedback-coupled between the first node and a second reference voltage; and a gate terminal of each of the second PFET and the second NFET being coupled to the second node. In some embodiments, the NE-inverter further includes: a third PFET coupled in series with the first PFET between the first reference voltage and the first node; a third NFET coupled in series with the first NFET between the first node and the second reference voltage; and a gate terminal of each of the third PFET and the third NFET being coupled to the second node. In some embodiments, the NE-inverter further includes: a fourth PFET coupled in series with the first and second PFETs between the first reference voltage and the first node; a fourth NFET coupled in series with the first and second NFETs between the first node and the second reference voltage; and a gate terminal of each of the fourth PFET and the fourth NFET being coupled to the second node. In some embodiments, the capacitive device includes: a second PFET feedback-coupled between the first node and the second node, the second PFET having a capacitor-configuration; and a second NFET feedback-coupled between the first node and the second node, the second NFET having a capacitor-configuration. In some embodiments, the capacitive device further includes: a third PFET coupled in series with the second PFET between the first node and the second node, the third PFET having a capacitor-configuration; and a third NFET coupled in series with the second NFET between the first node and the second node, the third NFET having a capacitor-configuration. In some embodiments, the capacitive device further includes: a fourth PFET coupled in series with the first and second PFETs between the first node and the second node, the fourth PFET having a capacitor-configuration; and a fourth NFET coupled in series with the first and second NFETs between the first node and the second node, the third NFET having a capacitor-configuration.

In some embodiments, the capacitive device further includes: a second PFET coupled in series with the first PFET between the first reference voltage and the first node, the first PFET having a capacitor-configuration; and a second NFET coupled in series with the first NFET between the first node and the first reference voltage, the second NFET having a capacitor-configuration. In some embodiments, the capacitive device further includes: a third PFET coupled in series with the first and second PFETs between the first reference voltage and the first node, the second PFET having a capacitor-configuration; a third NFET coupled in series with the first and second NFETs between the first node and the second reference voltage, the third NFET having a capacitor-configuration.

In some embodiments, a configuration (A) or a configuration (B) is true; for the configuration (A), an orientation of the capacitor-configuration of the first PFET is a gate-leading orientation in which a gate terminal of the first PFET is coupled to the first node whereas first and second source/drain (S/D) terminals of the first PFET are coupled to the second node, and an orientation of the capacitor-configuration of the first NFET is the gate-leading orientation in which a gate terminal of the first NFET is coupled to the first node whereas first and second S/D terminals of the first NFET are coupled to the second node; and for the configuration (B), the orientation of the capacitor-configuration of the first PFET is a gate-following orientation in which the gate terminal of the first PFET is coupled to the second node whereas the first and second S/D terminals of the first PFET are coupled to the first node, and the orientation of the capacitor-configuration of the first NFET is the gate-following orientation in which the gate terminal of the first NFET is coupled to the second node whereas the first and second S/D terminals of the first NFET are coupled to the first node. In some embodiments, a configuration (C) or a configuration (D) is true; for the configuration (C), an orientation of the capacitor-configuration of the first PFET is a gate-leading orientation in which a gate terminal of the first PFET is coupled to the first node whereas first and second source/drain (S/D) terminals of the first PFET are coupled to the second node, and an orientation of the capacitor-configuration of the first NFET is a gate-following orientation in which a gate terminal of the first NFET is coupled to the second node whereas first and second S/D terminals of the first NFET are coupled to the first node; and for the configuration (D), the orientation of the capacitor-configuration of the first PFET is the gate-following orientation in which the gate terminal of the first PFET is coupled to the second node whereas the first and second S/D terminals of the first PFET are coupled to the first node, and the orientation of the capacitor-configuration of the first NFET is the gate-leading orientation in which the gate terminal of the first NFET is coupled to the first node whereas the first and second S/D terminals of the first NFET are coupled to the second node.

In some embodiments, a buffer circuit (buffer) includes: a non-delay-enhanced inverter circuit (NE-inverter) having an output at a first node and an input at a second node; and a delay-enhanced inverter circuit (DE-inverter) having an output at a third node and an input at a fourth node, the DE-inverter including switching-configured (SW) field-effect transistors (FETs) (SW_FETs), and non-switching-configured (NS) FETs (NS_FETs); a configuration (A) or a configuration (B) being true; for the circumstance (A), the fourth node being the same as the first node; and for the configuration (B), the third node being the same as the second node.

In some embodiments, for the DE-inverter, a number of the NS_FETs is greater than zero and a number of the SW_FETs is greater than the number of the NS_FETs. In some embodiments, for the DE-inverter: a sum, $\Sigma$, of a number of SW_FETs, CSW, and the number of the NS_FETs (CNS), is $\Sigma = CSW + CNS$; and a ratio of the number of the NS_FETs divided by the sum is in a range as follows, $1/3 \leq (CSW/\Sigma) \leq 2/3$. In some embodiments, for the DE-inverter, the range as follows, $0.4 \leq (CSW/\Sigma) \leq 0.5$. In some embodiments, for the DE-inverter, the ratio is $CSW/\Sigma = 1/3$ or $CSW/\Sigma = 0.4$ or $CSW/\Sigma = 0.5$ or $CSW/\Sigma = 2/3$.

In some embodiments, the NE-inverter includes SW_FETs; and for the NE-inverter and the DE-inverter considered together, a number of the NS_FETs is greater than zero and a number of the SW_FETs is greater than the number of the NS_FETs. In some embodiments, a sum, $\Sigma$, of a number of SW_FETs, CSW, and the number of the NS_FETs (CNS), is $\Sigma = CSW + CNS$; and for the buffer, a ratio of the number of the NS_FETs divided by the sum is in a range as follows, $1/6 \leq (CSW/\Sigma) \leq 1/3$. In some embodiments, for the buffer, the ratio is $CSW/\Sigma = 1/6$ or $CSW/\Sigma = 0.25$ or $CSW/\Sigma = 1/3$.

In some embodiments, the NS_FETs of the DE-inverter are arranged as a capacitive device feedback-coupled between the third node and the fourth node. In some embodiments, each of the NS_FETs of the DE-inverter is configured as a capacitor (capacitor-configured); and the NS_FETs of the DE-inverter are coupled in parallel between the third node and the fourth node. In some embodiments, the NS_FETs of the capacitive device include: a first positive-channel metal-oxide (PMOS) FET (PFET) feedback-coupled between the third node and the fourth node, the first PFET having a capacitor-configuration; and a first negative-channel metal-oxide (NMOS) FET (NFET) feedback-coupled between the third node and the fourth node, the first NFET having a capacitor-configuration. In some embodiments, the capacitive device further includes: a second PFET coupled in parallel with the second PFET between the third node and the fourth node, the second PFET having a capacitor-configuration; and a second NFET coupled in parallel with the second NFET between the third node and the fourth node, the second NFET having a capacitor-configuration. In some embodiments, the capacitive device further includes: a third PFET coupled in parallel with the first and second PFETs between the third node and the fourth node, the third PFET having a capacitor-configuration; and a third NFET coupled in parallel with the first and second NFETs between the third node and the fourth node, the third NFET having a capacitor-configuration.

In some embodiments, a configuration (C) or a configuration (D) is true; for the configuration (C), an orientation of the capacitor-configuration of the first PFET is a gate-leading orientation in which a gate terminal of the first PFET is coupled to the fourth node whereas first and second source/drain (S/D) terminals of the first PFET are coupled to the third node, and an orientation of the capacitor-configuration of the first NFET is the gate-leading orientation in which a gate terminal of the first NFET is coupled to the node whereas first and second S/D terminals of the first NFET are coupled to the third node; and for the configuration (D), the orientation of the capacitor-configuration of the first PFET is a gate-following orientation in which the gate terminal of the first PFET is coupled to the third node whereas the first and second S/D terminals of the first PFET are coupled to the fourth node, and the orientation of the capacitor-configuration of the first NFET is the gate-following orientation in which the gate terminal of the first NFET is coupled to the third node whereas the first and second S/D terminals of the first NFET are coupled to the fourth node. In some embodiments, one of a configuration (E) or a configuration (F) is true; for the configuration (E), an orientation of the capacitor-configuration of the first PFET is a gate-leading orientation in which a gate terminal of the first PFET is coupled to the fourth node whereas first and second source/drain (S/D) terminals of the first PFET are coupled to the third node, and an orientation of the capacitor-configuration of the first NFET is a gate-following orientation in which a gate terminal of the first NFET is coupled to the third node whereas first and second S/D terminals of the first NFET are coupled to the fourth node; and for the configuration (F), the orientation of the capacitor-configuration of the first PFET is the gate-following orientation in which the gate terminal of the first PFET is coupled to the third node whereas the first and second S/D terminals of the first PFET are coupled to the fourth node, and the orientation of the capacitor-configuration of the first NFET is the gate-leading orientation in which the gate terminal of the first NFET is coupled to the fourth node whereas the first and second S/D terminals of the first NFET are coupled to the fourth node.

In some embodiments, a method (of forming semiconductor device that includes a delay-enhanced inverter circuit (DE-inverter)) includes: forming active regions including doping areas of a substrate; forming source/drain (S/D) regions including doping first areas of the active regions, the S/D regions representing first transistor-components, wherein second areas of the active regions which are between corresponding S/D regions are channel regions representing second transistor-components; forming gate lines over corresponding ones of the channel regions, the gate lines representing third transistor-components; and forming metal-to-S/D (MD) contact structures over corresponding ones of the S/D regions, the MD contact structures representing fourth transistor-components;

forming interconnection structures representing fifth transistor-components over corresponding ones of the gate lines and the MD contact structures, the interconnection structures defining a first set of the first to fourth transistor-components as corresponding switching-configured transistors, and a second set of the first to fourth transistor-components as corresponding non-switching-configured transistors; and forming metallization segments over corresponding ones of the interconnection structures, the metallization segments connecting the switching-configured transistors of the first set of the first to fourth transistor-components as a non-delay-enhanced inverter circuit (NE-inverter) having an output at a first node and an input at a second node, and the non-switching-configured transistors of the second set of the first to fourth transistor-components as a capacitive device feedback-coupled between the first node and the second node, the capacitive device including a first non-switching-configured positive-channel metal-oxide (PMOS) field-effect transistor (FET) (PFET) feedback-coupled between the first node and the second node, the first PFET having a capacitor-configuration, and a first non-switching-configured negative-channel metal-oxide (NMOS) FET (NFET) feedback-coupled between the first node and the second node, the first NFET having a capacitor-configuration.

In some embodiments, the switching-configured transistors of the NE-inverter include: a first switching-configured PFET feedback-coupled between the first reference voltage and the first node, and a first switching-configured NFET feedback-coupled between the first node and the second reference voltage; and a gate terminal of each of the first SW_PFET and the first SW_NFET being coupled to the second node.

In some embodiments, the non-switching-configured transistors of the NE-inverter further including: a second SW_PFET coupled in series with the first SW_PFET between the first reference voltage and the first node; a second SW_NFET coupled in series with the first SW_NFET between the first node and the second reference voltage; and a gate terminal of each of the second SW_PFET and the second SW_NFET being coupled to the second node.

In some embodiments, the non-switching-configured transistors of the NE-inverter further include: a third SW_PFET coupled in series with the first and second SW_PFETs between the first reference voltage and the first node; a third SW_NFET coupled in series with the first and second SW_NFETs between the first node and the second reference voltage; and a gate terminal of each of the third SW_PFET and the third SW_NFET being coupled to the second node.

In some embodiments, the non-switching-configured transistors that define a capacitive device further include: a second SW_PFET coupled in parallel with the first SW_PFET between the first node and the second node, the second SW_PFET having a capacitor-configuration; and a second SW_NFET coupled in parallel with the first SW_N-FET between the first node and the second node, the second SW_NFET having a capacitor-configuration.

In some embodiments, the non-switching-configured transistors of the capacitive device further include: a third SW_PFET coupled in parallel with the first and second SW_PFETs between the first node and the second node, the third SW_PFET having a capacitor-configuration; and a third SW_NFET coupled in parallel with the first and second SW_NFETs between the first node and the second node, the third SW_NFET having a capacitor-configuration.

In some embodiments, the non-switching-configured transistors that define a capacitive device conform to a configuration (A) or a configuration (B); for the configuration (A), an orientation of the capacitor-configuration of the first SW_PFET is a gate-leading orientation in which a gate terminal of the first SW_PFET is coupled to the second node whereas first and second source/drain (S/D) terminals of the first SW_PFET are coupled to the first node, and an orientation of the capacitor-configuration of the first SW_NFET is the gate-leading orientation in which a gate terminal of the first SW_NFET is coupled to the second node whereas first and second S/D terminals of the first SW_NFET are coupled to the first node; and for the configuration (B), the orientation of the capacitor-configuration of the first SW_PFET is a gate-following orientation in which the gate terminal of the first SW_PFET is coupled to the first node whereas the first and second S/D terminals of the first SW_PFET are coupled to the second node; and the orientation of the capacitor-configuration of the first SW_NFET is the gate-following orientation in which the gate terminal of the first SW_NFET is coupled to the first node whereas the first and second S/D terminals of the first SW_NFET are coupled to the second node.

In some embodiments, the non-switching-configured transistors of the capacitive device conform to a configuration (C) or a configuration (D); for the configuration (C), an orientation of the capacitor-configuration of the first SW_PFET is a gate-leading orientation in which a gate terminal of the first SW_PFET is coupled to the second node whereas first and second source/drain (S/D) terminals of the first SW_PFET are coupled to the first node, and an orientation of the capacitor-configuration of the first SW_NFET is a gate-following orientation in which a gate terminal of the first SW_NFET is coupled to the first node whereas first and second S/D terminals of the first SW_NFET are coupled to the second node; and for the configuration (D): the orientation of the capacitor-configuration of the first SW_PFET is the gate-following orientation in which the gate terminal of the first SW_PFET is coupled to the first node whereas the first and second S/D terminals of the first SW_PFET are coupled to the second node, and the orientation of the capacitor-configuration of the first SW_NFET is the gate-leading orientation in which the gate terminal of the first SW_NFET is coupled to the second node whereas the first and second S/D terminals of the first SW_NFET are coupled to the first node.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A buffer circuit (buffer) comprising:
a non-delay-enhanced inverter circuit (NE-inverter) having an output at a first node and an input at a second node; and
a delay-enhanced inverter circuit (DE-inverter) having an output at a third node and an input at a fourth node, the DE-inverter including:
    switching-configured (SW) field-effect transistors (FETs) (SW_FETs); and
    non-switching-configured (NS) FETs (NS_FETs);
a configuration (A) or a configuration (B) being true;
for the configuration (A):
    the fourth node being the same as the first node and
for the configuration (B):
    the third node being the same as the second node; and
wherein each of the NS_FETs of the DE-inverter is configured as a capacitor; and
wherein for each of the NS_FETs of the DE-inverter:
    a gate terminal thereof is coupled to one of the third node or the fourth node and is free of having an inverter coupled therebetween, and
    source/drain (S/D) terminals thereof are coupled correspondingly to the fourth node or the third node and is free of having an inverter coupled therebetween.

2. The buffer of claim 1, wherein:
for the DE-inverter, a number of the NS_FETs is greater than zero and a number of the SW_FETs is greater than the number of the NS_FETs.

3. The buffer of claim 2, wherein:
for the DE-inverter:
    a sum ($\Sigma$) of a number of SW_FETs (CSW) and the number of the NS_FETs (CNS) is $\Sigma$=CSW+CNS; and
    a ratio of the number of the NS_FETs divided by the sum is in a range as follows, $1/3 \leq (CSW/\Sigma) \leq 2/3$.

4. The buffer of claim 3, wherein:
for the DE-inverter, the range as follows, $0.4 \leq (CSW/\Sigma) \leq 0.5$.

5. The buffer of claim 3, wherein:
for the DE-inverter, the ratio is $CSW/\Sigma=1/3$ or $CSW/\Sigma=0.4$ or $CSW/\Sigma=0.5$ or $CSW/\Sigma=2/3$.

6. The buffer of claim 1, wherein:
the NE-inverter includes SW_FETs; and
for the NE-inverter and the DE-inverter being considered together, a number of the NS_FETs is greater than zero and a number of the SW_FETs is greater than the number of the NS_FETs.

7. The buffer of claim 6, wherein:
a sum ($\Sigma$) of a number of SW_FETs (CSW) and the number of the NS_FETs (CNS) is $\Sigma$=CSW+CNS; and
for the buffer, a ratio of the number of the NS_FETs divided by the sum is in a range as follows, $1/6 \leq (CSW/\Sigma) \leq 1/3$.

8. The buffer of claim 7, wherein:
for the buffer, the ratio is $CSW/\Sigma=1/6$ or $CSW/\Sigma=0.25$ or $CSW/\Sigma=1/3$.

9. The buffer of claim 1, wherein:
the NS_FETs of the NS_FETs of the DE-inverter include:
    a first positive-channel metal-oxide (PMOS) FET (PFET) feedback-coupled between the third node and the fourth node, the first PFET having a capacitor-configuration; and a first negative-channel metal-oxide (NMOS) FET (NFET) feedback-coupled between the third node and the fourth node, the first NFET having a capacitor-configuration.

10. The buffer of claim 9, wherein the NS_FETs of the DE-inverter capacitive device further include:

a third PFET coupled in parallel with the second PFET between the third node and the fourth node, the second PFET having a capacitor-configuration; and a third NFET coupled in parallel with the second NFET between the third node and the fourth node, the second NFET having a capacitor-configuration.

11. The buffer of claim 10, wherein the NS_FETs of the DE-inverter further include:

a third PFET coupled in parallel with the first and second PFETs between the third node and the fourth node, the third PFET having a capacitor-configuration; and a third NFET coupled in parallel with the first and second NFETs between the third node and the fourth node, the third NFET having a capacitor-configuration.

12. The buffer of claim 9, wherein:

a configuration (C) or a configuration (D) is true;

for the configuration (C):

an orientation of the capacitor-configuration of the first PFET is a gate-leading orientation in which a gate terminal of the first PFET is coupled to the fourth node whereas first and second source/drain (S/D) terminals of the first PFET are coupled to the third node; and an orientation of the capacitor-configuration of the first NFET is the gate-leading orientation in which a gate terminal of the first NFET is coupled to the fourth node whereas first and second S/D terminals of the first NFET are coupled to the third node; and for the configuration (D):

the orientation of the capacitor-configuration of the first PFET is a gate-following orientation in which the gate terminal of the first PFET is coupled to the third node whereas the first and second S/D terminals of the first PFET are coupled to the fourth node; and the orientation of the capacitor-configuration of the first NFET is the gate-following orientation in which the gate terminal of the first NFET is coupled to the third node whereas the first and second S/D terminals of the first NFET are coupled to the fourth node.

13. The buffer of claim 9, wherein:

a configuration (C) or a configuration (D) is true;

for the configuration (C):

an orientation of the capacitor-configuration of the first PFET is a gate-leading orientation in which a gate terminal of the first PFET is coupled to the fourth node whereas first and second source/drain (S/D) terminals of the first PFET are coupled to the third node; and an orientation of the capacitor-configuration of the first NFET is a gate-following orientation in which a gate terminal of the first NFET is coupled to the third node whereas first and second S/D terminals of the first NFET are coupled to the fourth node; and for the configuration (D):

the orientation of the capacitor-configuration of the first PFET is the gate-following orientation in which the gate terminal of the first PFET is coupled to the third node whereas the first and second S/D terminals of the first PFET are coupled to the fourth node; and the orientation of the capacitor-configuration of the first NFET is the gate-leading orientation in which the gate terminal of the first NFET is coupled to the fourth node whereas the first and second S/D terminals of the first NFET are coupled to the fourth node.

14. The buffer of claim 1, wherein:

wherein, for one or more first ones of the NS_FETs of the DE-inverter, the gate terminal thereof is coupled to the third node; and wherein, for one or more second ones of the NS_FETs of the DE-inverter, the gate terminal thereof is coupled to the fourth node.

15. The buffer of claim 1, wherein:

wherein for each of NS_FETs of the DE-inverter, the gate terminal thereof is coupled to the third node; or wherein for each of the NS_FETs of the DE-inverter, the gate terminal thereof is coupled to the fourth node.

16. A buffer circuit (buffer) comprising:

a non-delay-enhanced inverter circuit (NE-inverter) having an output at a first node and an input at a second node; and a delay-enhanced inverter circuit (DE-inverter) having an output at a third node and an input at a fourth node, the DE-inverter including:

switching-configured (SW) field-effect transistors (FETs) (SW_FETs); and non-switching-configured (NS) FETs (NS_FETs);

the NE-inverter including SW_FETs;

for the NE-inverter and the DE-inverter being considered together, a number of the NS_FETs is greater than zero and a number of the SW_FETs is greater than the number of the NS_FETs;

a configuration (A) or a configuration (B) being true;

for the configuration (A):

the fourth node being the same as the first node and for the configuration (B):

the third node being the same as the second node; and wherein each of the NS_FETs of the DE-inverter is configured as a capacitor; and wherein for each of the NS_FETs of the DE-inverter:

a gate terminal thereof is coupled to one of the third node or the fourth node and is free of having an inverter coupled therebetween, and source/drain (S/D) terminals thereof are coupled correspondingly to the fourth node or the third node and are free of having an inverter coupled therebetween.

17. The buffer of claim 16, wherein:

a sum $(\Sigma)$ of a number of SW_FETs (CSW) and the number of the NS_FETs (CNS) is $\Sigma = CSW + CNS$; and for the buffer, a ratio of the number of the NS_FETs divided by the sum is in a range as follows, $1/6 \leq (CSW/\Sigma) \leq 1/3$.

18. The buffer of claim 17, wherein:

for the buffer, the ratio is $CSW/\Sigma = 1/6$ or $CSW/\Sigma = 0.25$ or $CSW/\Sigma = 1/3$.

19. The buffer of claim 16, wherein:

wherein for each of NS_FETs of the DE-inverter, the gate terminal thereof is coupled to the third node; or wherein for each of the NS_FETs of the DE-inverter, the gate terminal thereof is coupled to the fourth node.

20. A buffer circuit (buffer) comprising:

a non-delay-enhanced inverter circuit (NE-inverter) having an output at a first node and an input at a second node; and a delay-enhanced inverter circuit (DE-inverter) having an output at a third node and an input at a fourth node, the DE-inverter including:

switching-configured (SW) field-effect transistors (FETs) (SW_FETs); and non-switching-configured (NS) FETs (NS_FETs);

a configuration (A) or a configuration (B) being true;

for the configuration (A):

the fourth node being the same as the first node and for the configuration (B):

the third node being the same as the second node; and wherein the NS_FETs of the DE-inverter are arranged as a capacitive device feedback-coupled between the third node and the fourth node; and wherein for each of the NS_FETs of the DE-inverter:

a gate terminal thereof is coupled to one of the third node or the fourth node, and source/drain (S/D) terminals thereof are coupled correspondingly to the fourth node or the third node;

wherein, for one or more first ones of the NS_FETs of the DE-inverter, the gate terminal thereof is coupled to the third node and is free of having an inverter coupled therebetween; and wherein, for one or more second ones of the NS_FETs of the DE-inverter, the gate terminal thereof is coupled to the fourth node and are free of having an inverter coupled therebetween.

* * * * *